(12) United States Patent
Kuh et al.

(10) Patent No.: US 7,741,631 B2
(45) Date of Patent: Jun. 22, 2010

(54) PHASE-CHANGEABLE MEMORY DEVICES INCLUDING PHASE-CHANGEABLE MATERIALS ON SILICON NITRIDE LAYERS

(75) Inventors: Bong-Jin Kuh, Gyeonggi-do (KR); Yong-Ho Ha, Gyeonggi-do (KR); Ji-Hye Yi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 13 days.

(21) Appl. No.: 12/147,996

(22) Filed: Jun. 27, 2008

(65) Prior Publication Data

US 2008/0258128 A1 Oct. 23, 2008

Related U.S. Application Data

(62) Division of application No. 11/205,742, filed on Aug. 17, 2005, now Pat. No. 7,394,087.

(30) Foreign Application Priority Data

Aug. 17, 2004 (KR) ...................... 10-2004-0064712

(51) Int. Cl.
*H01L 29/02* (2006.01)
(52) U.S. Cl. .................. 257/2; 257/3; 257/4; 257/5; 257/E29.002; 438/102; 438/103; 365/163
(58) Field of Classification Search .................. 257/1–5; 438/102–103; 365/163
See application file for complete search history.

(56) References Cited

U.S. PATENT DOCUMENTS 6,744,088 B1 * 6/2004 Dennison ..................... 257/296

| | | | |
|---|---|---|---|
| 2001/0002046 A1 * | 5/2001 | Reinberg et al. | 257/3 |
| 2002/0017701 A1 | 2/2002 | Klersy et al. | 257/536 |
| 2003/0127669 A1 | 7/2003 | Doan et al. | 257/246 |
| 2003/0209746 A1 | 11/2003 | Horii | 257/295 |
| 2004/0004237 A1 * | 1/2004 | Fox | 257/295 |
| 2004/0023489 A1 * | 2/2004 | Chopra | 438/687 |

FOREIGN PATENT DOCUMENTS

| KR | 10-2003-0086820 A | 11/2003 |
|---|---|---|
| KR | 10-2004-0017694 A | 2/2004 |
| KR | 10-2004-0017695 | 2/2004 |

OTHER PUBLICATIONS

Notice to Submit a Response for Korean Patent Application No. 10-2004-0064712 mailed Mar. 16, 2006.

* cited by examiner

*Primary Examiner*—Bradley K Smith
*Assistant Examiner*—Jami M Valentine
(74) *Attorney, Agent, or Firm*—Myers Bigel Sibley & Sajovec

(57) ABSTRACT

A phase-changeable memory device includes a substrate having a contact region on an upper surface thereof. An insulating interlayer on the substrate has an opening therein, and a lower electrode is formed in the opening. The lower electrode has a nitrided surface portion and is in electrical contact with the contact region of the substrate. A phase-changeable material layer pattern is on the lower electrode, and an upper electrode is on the phase-changeable material layer pattern. The insulating interlayer may have a nitrided surface portion and the phase-changeable material layer may be at least partially on the nitrided surface portion of the insulating interlayer. Methods of forming phase-changeable memory devices are also disclosed.

10 Claims, 17 Drawing Sheets

PHASE-CHANGEABLE MEMORY DEVICES INCLUDING PHASE-CHANGEABLE MATERIALS ON SILICON NITRIDE LAYERS

CROSS REFERENCE TO RELATED APPLICATION

This application is a divisional of and claims priority to U.S. patent application Ser. No. 11/205,742, filed on Aug. 17, 2005 now U.S. Pat. No. 7,394,087 and claims priority under 35 USC §119 to Korean Patent Application No. 2004-64712 filed on Aug. 17, 2004, the disclosures of which are incorporated herein by reference in their entirety.

FIELD OF THE INVENTION

The present invention relates to semiconductor memory devices and methods of forming semiconductor memory devices. More particularly, the present invention relates to phase-changeable memory devices and methods of forming phase-changeable memory devices.

BACKGROUND

Semiconductor memory devices are widely used in electronic circuits. Some examples of semiconductor memory devices are dynamic random access memory (DRAM) devices, static random access memory (SRAM) devices, and flash memory devices.

A semiconductor memory device may be classified as either a volatile memory device or a non-volatile memory device. A volatile memory device may lose data stored in the device when power is removed from the device. On the other hand, a nonvolatile memory device may retain its data even without power. Flash memory devices, which are a type of nonvolatile memory device, are frequently used for storing data. However, flash memory devices are not generally configured as random access memory devices. In addition, flash memory devices are disadvantageous in that the time required for reading or writing data from or to such devices may be relatively long.

In order to overcome some or all of these disadvantages, ferroelectric random access memory (FRAM) devices, magnetic random access memory (MRAM) devices, and phase-changeable random access memory (PRAM) devices have been developed.

A PRAM device may read or erase its data by using a phase-changeable material. When heat is applied to the phase-changeable material, the state of the phase-changeable material may be changed from a crystalline state to an amorphous state. When heat is removed from the phase-changeable material, the state of the phase-changeable material may be changed from the amorphous state back to a crystalline state. The phase-changeable material may generally be a chalcogenide.

PRAM devices having a highly integrated structure and/or capable of operating with a relatively low voltage have been developed. In particular, structural features of a PRAM device unit cell, or of an electrical circuit that is included in the PRAM device, may be changed to enable the PRAM device to be highly integrated. For example, a PRAM device may have a T-shape structure, a confined structure and/or an edge contact structure.

In addition, providing thermal insulation of the phase-changeable material and/or decreasing the size of the programming region of a PRAM device may enable the PRAM to operate with a relatively low power.

A PRAM device may operate as follows. Electrical current applied to a lower electrode may generate Joule's heat, which may change the phase of a layer of phase-changeable material so that data may be stored in the PRAM device. The PRAM device may read the data using a variation of the resistance of the layer of phase-changeable material due to a phase change of the layer of phase-changeable material.

Generally, the portion of the layer of the phase-changeable material where the phase change occurs may be referred to as the "programming region." When the programming region has an amorphous state, the state of the PRAM device is referred to as the "reset state." On the other hand, when the programming region has a crystalline state, the state of the PRAM device is referred to as the "set state." The resistance of the portion of the programming region making contact with the lower electrode may be relatively high in the reset state. On the other hand, the resistance of the portion of the programming region making contact with the lower electrode is relatively low in the set state.

In order to allow a PRAM device to operate efficiently, the state of the portion of the programming region making contact with the lower electrode should switch rapidly between the amorphous and crystalline states with the aid of the electrical current applied to the lower electrode.

When the area of the programming region is relatively large, the current required to rapidly change the state of the programming region may also be large. Thus, in order to enable the PRAM device to operate with relatively low power, the area of the programming region may be reduced.

If the phase-changeable material layer is not thermally insulated, heat applied to the phase-changeable material layer may be easily dissipated. Thus, it may become necessary to apply a relatively large current to the lower electrode to change the phase of the phase-changeable material layer. As a result, it may be preferable to thermally insulate the phase-changeable material layer.

In addition, in order to enable the phase-changeable memory device to operate with the relatively low current, the reset current required to reset the phase-changeable memory device should be relatively small. Furthermore, the initial current required to initially activate the phase-changeable memory device should be relatively small. The initial activation of the phase-changeable memory device is referred to herein as a "first firing."

In particular, it may be desirable for the initial current to be similar in magnitude to the normal current required for driving the PRAM device after the first firing. An example of such normal current is the reset current. However, in conventional devices, if the initial current is similar in magnitude to the normal current, the first firing may not occur.

The first firing will now be briefly described. The heat required for initial activation of a PRAM device may be substantially larger than that required for driving the PRAM device after the initial activation. Thus, when a PRAM device is initially activated, it may be necessary to apply a current to the lower electrode substantially larger than that required for driving the PRAM device after the initial activation in order to generate the heat required for the initial activation.

After the first firing, relatively low heat may be required to change the phase of the phase-changeable material layer in a PRAM device. Thus, a relatively low current may be applied to the lower electrode after the first firing.

Since a relatively large initial current may be applied to the lower electrode in the first firing, it may be necessary to apply a relatively high voltage to a source region of a transistor that supplies the initial current. Thus, the structure of the PRAM device should be capable of minimizing damage that may occur due to the relatively large current and high voltage required for the first firing. It may be difficult to manufacture a highly integrated PRAM device due to these constraints.

If structural changes of the unit cell or the electrical circuit are implemented to overcome the above-described problems, the time and cost required for changing existing facilities may be excessive. In addition, phase-changeable material in general has unique characteristics. Thus, development of phase-changeable materials is also difficult.

SUMMARY OF THE INVENTION

Embodiments of the invention provide a phase-changeable memory device including a substrate having a contact region on an upper surface thereof. An insulating interlayer on the substrate has an opening therein, and a lower electrode is formed in the opening. The lower electrode has a nitrided surface portion and is in electrical contact with the contact region of the substrate. A phase-changeable material layer pattern is on the lower electrode, and an upper electrode is on the phase-changeable material layer pattern.

In some embodiments of the invention, the insulating interlayer may have a nitrided surface portion and the phase-changeable material layer may be at least partially on the nitrided surface portion of the insulating interlayer. The lower electrode may have a nitrided surface portion and the phase-changeable material layer may be at least partially on the nitrided surface portion of the lower electrode.

In some embodiments of the invention, a nitride spacer is on a sidewall of the opening in the insulating interlayer. The nitride spacer may include an oxynitride layer on a sidewall of the opening and a nitride layer on the oxynitride layer. The nitride layer may include silicon nitride. Furthermore, the nitride spacer may include a nitrided surface portion.

In further embodiments of the invention, a seed layer pattern is provided between the lower electrode and the phase-changeable material layer pattern. The seed layer pattern may include a material of a GeTe—$Sb_2Te_3$ binary system.

The seed layer pattern may be doped with nitrogen and/or oxygen and/or a transition metal. The seed layer pattern may further include an InGeSbTe compound, a GeSnSbTe compound, GeN and/or InN. In particular embodiments of the invention, the seed layer pattern may have a thickness of from about 10 Å to about 100 Å.

In some embodiments of the invention, a silicon nitride layer is provided on the insulating interlayer and the seed layer pattern is at least partially on the silicon nitride layer. The silicon nitride layer may include a nitrided surface portion.

In further embodiments of the invention, a phase-changeable memory device further includes a transistor on the substrate having a gate electrode, a channel region beneath the gate electrode, and a drain region and a source region adjacent the channel region. A lower insulating interlayer is on the substrate at least partially covering the transistor. A first pad formed through the lower insulating interlayer is in contact with the drain region and a lower wiring pattern. In some embodiments, a second pad extends through the lower insulating interlayer and is in electrical contact with the source region and the lower electrode.

Some embodiments of the invention provide a phase-changeable memory device including a substrate having a contact region therein, an insulating interlayer on the substrate and a silicon nitride layer on the insulating interlayer. A lower electrode extends through the silicon nitride layer and the insulating interlayer and is in electrical contact with the contact region of the substrate. A phase-changeable material layer pattern is on the lower electrode and the silicon nitride layer, and an upper electrode is on the phase-changeable material layer pattern. In some embodiments, the silicon nitride layer and the lower electrode may have nitrided surface portions.

In some embodiments of the invention, a seed layer pattern is provided on the lower electrode and the silicon nitride layer beneath the phase-changeable material layer pattern. The seed layer pattern may include a material of a GeTe—$Sb_2Te_3$ binary system and may be doped with nitrogen, oxygen, and/or a transition metal.

In some embodiments, the seed layer pattern may include an InGeSbTe compound, a GeSnSbTe compound, GeN and/or InN.

Some embodiments of the invention provide methods of manufacturing phase-changeable memory devices including forming a contact region in a substrate, forming an insulating interlayer on the substrate and forming an opening in the insulating interlayer. A lower electrode is formed in the opening in the insulating interlayer to make contact with the contact region in the substrate. Surface portions of the insulating interlayer and the lower electrode are nitrided. A phase-changeable material layer is formed on the lower electrode, and an upper electrode is formed on the phase-changeable material layer. In some embodiments of the invention, the lower electrode may have a contact resistance of about 100 kΩ or lower.

Methods according to some embodiments of the invention include nitriding surface portions of the insulating interlayer and the lower electrode by exposing the insulating interlayer and the lower electrode to nitrogen gas at a temperature of about 200° C. to about 300° C.

Methods according to further embodiments of the invention include forming a spacer on a sidewall of the opening in the insulating interlayer prior to forming the lower electrode in the opening.

In some embodiments of the invention, a seed layer may be formed on the lower electrode and the insulating interlayer prior to forming the phase-changeable material layer. The seed layer may include a material of a GeTe—$Sb_2Te_3$ binary system which may be doped with nitrogen, oxygen and/or a transition metal during formation of the seed layer. In some embodiments, the seed layer may include an InGeSbTe compound, a GeSnSbTe compound, GeN and/or InN. The seed layer may have a thickness of from about 10 Å to about 100 Å.

Methods according to some embodiments of the invention further include forming a transistor on the substrate having a gate electrode, a channel region beneath the gate electrode, and source and drain regions adjacent the channel region. A lower insulating interlayer is formed on the substrate to cover the transistor, and a first pad is formed through the lower insulating interlayer making contact with the drain region. A lower wiring pattern is formed on the first pad. Some embodiments of the invention further include forming a second pad through the lower insulating interlayer making electrical contact with the lower electrode and the source region.

Methods of manufacturing phase-changeable memory devices according to still further embodiments of the invention include forming an insulating interlayer on a substrate, forming a silicon nitride layer on the insulating interlayer, and forming an opening in the silicon nitride layer and the insulating interlayer. A lower electrode is formed in the opening making contact with a contact region of the substrate through the silicon nitride layer and the insulating interlayer. A phase-changeable material layer is formed on the lower electrode, an upper electrode is formed on the phase-changeable material layer.

In some embodiments of the invention, the silicon nitride layer may have a thickness of from about 50 Å to about 200 Å.

In some embodiments of the invention, the silicon nitride layer and the lower electrode may be nitrided. Moreover, in further embodiments of the invention, a seed layer may be formed on the lower electrode and the silicon nitride layer. A spacer may be formed on a sidewall of the opening prior to forming the lower electrode.

Some embodiments of the present invention may provide highly integrated phase-changeable memory devices operated with low voltage. Furthermore, some embodiments of the present invention may provide methods of manufacturing highly integrated phase-changeable memory devices.

Embodiments of the invention provide a phase-changeable memory device having a phase-changeable material layer pattern. Some embodiments of the invention provide a phase-changeable memory device including a phase-changeable material layer pattern having a substantially uniform crystalline structure and/or a uniform grain size so that the phase-changeable memory device may operate with a relatively low driving voltage. Thus, in memory devices according to some embodiments of the invention, some electrical characteristics of the phase-changeable memory device may be improved. Additionally, cells of a phase-changeable memory device formed in accordance with some embodiments of the invention may be highly integrated.

DETAILED DESCRIPTION OF EMBODIMENTS OF THE INVENTION

Figure 1:
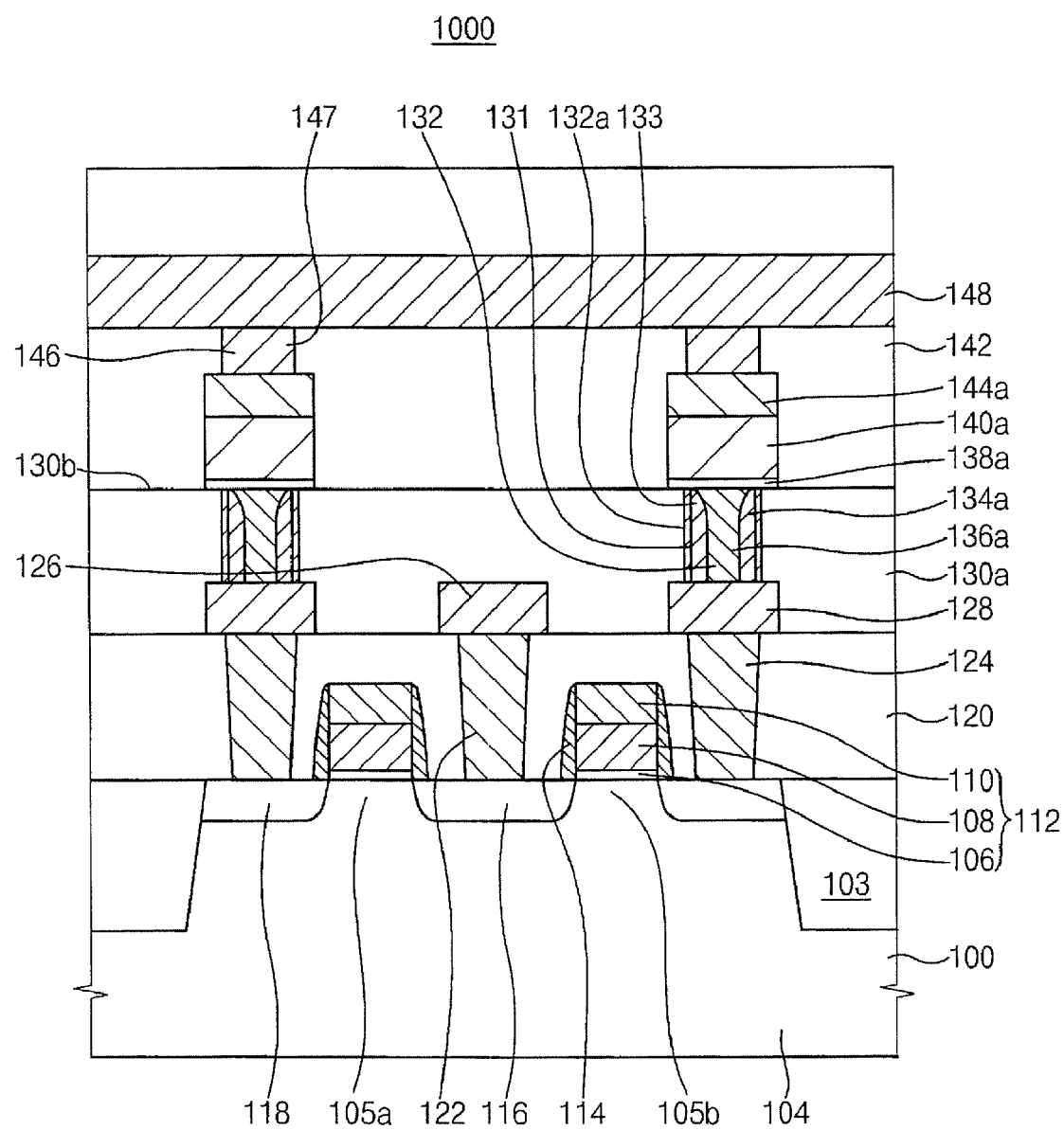
FIG. 1 is a cross-sectional view illustrating phase-changeable memory devices and associated methods in accordance with some embodiments of the invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity. It will be understood that when an element or layer is referred to as being "on" or "connected to" another element or layer, it can be directly on or directly connected to the other element or layer or intervening elements or layers may be present. Like reference numerals refer to like elements throughout.

It will be understood that, although the terms first, second, etc. may be used herein to describe various elements, components or layers, these elements, components or layers should not be limited by these terms. These terms are only used to distinguish one element, component or layer from another element, component or layer. Thus, a first element, component or layer discussed below could be termed a second element, component or layer without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, elements or components, but do not preclude the presence or addition of one or more other features, elements or components.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

FIG. 1 is a cross-sectional view illustrating a phase-changeable memory device 1000 and associated methods in accordance with some embodiments of the invention.

Referring to FIG. 1, an isolation layer 103 may be formed on a substrate 100 to define an active region 104 in the substrate 100. The isolation layer 103 may be formed on the substrate 100, for example, by a shallow trench isolation (STI) process.

At least one transistor 105a, 105b may be formed on the active region. Each of the transistors 105a, 105b may include a gate structure 112, a first contact region 116, and a second contact region 118. The first and the second contact regions 116, 118 may correspond to source/drain regions, respectively of the transistors 105. The source/drain regions 116, 118 are adjacent a channel region 107 in the substrate 100 below the gate structure 112. The gate structure 112 may include a gate insulation pattern 106, a gate electrode pattern 108 and a hard mask pattern 110. A gate spacer 114 may be formed on a sidewall of the gate structure 112. The first contact region 116 may be referred to as the source region with which a lower wiring pattern 126 makes electrical contact, and the second contact region 118 may be referred to as the drain region where a lower electrode 136a is electrically connected. The source region 116 may be shared among multiple transistors 105a, 105b formed on the substrate 100, whereas a drain region 118 may belong to a single transistor 105a, 105b.

A lower insulating interlayer 120 may be formed on the substrate 100 and the isolation layer 103 to cover the transistors 105a, 105b. A first pad 122 may be formed through the lower insulating interlayer 120 to contact the source region 116. A second pad 124 may be formed through the lower insulating interlayer 120 to make contact with the drain region 118.

The lower wiring pattern 126 may be formed on the first pad 122. The lower wiring pattern 126 may include a conductive material such as a metal or polysilicon doped with impurities. For example, the lower wiring pattern 126 may include tungsten (W), aluminum (Al), tantalum (Ta), titanium (Ti), copper (Cu), etc. These materials may be used alone or in a mixture thereof. Since the electrical resistance of copper and/or tungsten is substantially low, the lower wiring pattern 126 may include tungsten or copper in some embodiments of the present invention.

A conductive pattern 128 may be formed on the second pad 124 to make electrical contact with the drain region 118 through the second pad 124. The conductive pattern 128 may include a conductive material similar or identical to that of the lower wiring pattern 126. Alternatively, the conductive pattern 128 may include a conductive material substantially different from that of the lower wiring pattern 126.

A first insulating interlayer 130a may be formed on the lower insulating interlayer 120, the lower wiring pattern 126 and the conductive pattern 128. The first insulating interlayer 130a may include an oxide. For example, the first insulating interlayer 130a may include boro-phosphor silicate glass (BPSG), phosphor silicate glass (PSG), undoped silicate glass (USG), spin on glass (SOG), tetraethylorthosilicate (TEOS), plasma enhanced-TEOS (PE-TEOS), high density plasma-chemical vapor deposition (HDP-CVD) oxide, etc., and/or a combination of any of the foregoing.

A surface portion 130b of the first insulating interlayer 130a may be nitrided. For example, a surface portion 130b of the first insulating interlayer 130a may be converted into an oxynitride film by a nitration process. Since the surface portion 130b of the first insulating interlayer 130a may be nitrided, nitrogen (N) included in the surface portion 130a of the first insulating interlayer 130a may assist the crystalline growth of a phase-changeable material in a phase-changeable material layer pattern 140a. For example, the phase-changeable material may have a face centered cubic (FCC) structure due to nitrogen in the surface portion 130b of the first insulating interlayer 130a.

A first opening 132 may be formed through the first insulating interlayer 130a to expose the conductive pattern 128. A spacer 134a may be formed on a sidewall 132a of the first opening. The spacer 134a may reduce the width of the first opening 132. In some embodiments of the invention, the width of the first opening 132 may be reduced in half by the spacer 134a. A surface portion of the spacer 134a may also be nitrided. Alternatively, the spacer 134a may be formed using a nitride such as silicon nitride.

As illustrated in FIG. 1, the spacer 134a may have a double layer structure that includes an oxynitride layer 131 formed on the sidewall 132a of the first opening, and a nitride layer 133 formed on the oxynitride layer 131. For example, the oxynitride layer 131 may include silicon oxynitride, and the nitride layer 133 may include silicon nitride. Alternatively, the spacer 134a may have a single layer structure that includes one layer of silicon nitride and/or silicon oxynitride.

When the width of the first opening decreases due to the presence of the spacer 134a, the width of the lower electrode 136a also may decrease because the lower electrode 136a is formed in the first opening 136. When the width of the lower electrode 136a decreases, a phase-changeable region of the phase-changeable material layer pattern 140a (e.g., a programming region of the phase-changeable material layer pattern 140a) may have a reduced size so that the phase-changeable memory device 1000 may operate with a relatively low voltage.

The lower electrode 136a may be formed in the first opening 132 to make electrical contact with the conductive pattern 128. A surface portion of the lower electrode 136a may also be nitrided so that the surface portion of the lower electrode 136a includes nitrogen. Nitrogen included in the surface portion of the lower electrode 136a may additionally aid the crystalline growth of the phase-changeable material formed on the lower electrode 136a in the phase-changeable material layer pattern 140a. Accordingly, the phase-changeable material may have a more uniform FCC structure due to nitrogen in the surface portion of the lower electrode 136a. In some embodiments of the invention, the lower electrode 136a may include a metal such as tungsten, aluminum, tantalum, titanium, and/or copper, etc. These materials may be used alone or in a mixture of one or more such materials.

In other embodiments of the invention, the lower electrode 136a may include a polysilicon doped with impurities. In still further embodiments of the invention, the lower electrode 136a may include a conductive metal nitride such as titanium nitride, aluminum nitride, tungsten nitride, and/or titanium aluminum nitride, etc. The surface portion of the lower electrode 136a may have a resistance of below about 100 kΩ. Namely, the lower electrode 136a may include a nitrided surface portion that has a resistance of below about 100 kΩ.

As described above, the surface portions of the lower electrode 136a, the first insulating interlayer 130a and the spacer 134a may be positioned in one plane. Additionally, the surface portions of the lower electrode 136a, the first insulating interlayer 130a and the spacer 134a may be nitrided. Thus, all of the surface portions of the lower electrode 136a, the first insulating interlayer 130a and the spacer 134a may have uniform structures and/or uniform grain sizes even though the lower electrode 136a, the first insulating interlayer 130a and the spacer 134a may include substantially different materials.

A seed layer pattern 138a may be formed on the surface portions of the lower electrode 136a, the first insulating interlayer 130a and the spacer 134a. Particularly, the seed layer pattern 138a may fully cover the surface portion of the lower electrode 136a. The seed layer pattern 138a may assist the crystalline growth of the phase-changeable material so that the phase-changeable material layer pattern 140a may have a uniform crystal structure and/or a uniform grain size. The seed layer pattern 138a may have a thickness of about 10 Å to about 100 Å.

The seed layer pattern 138a may include a chalcogenide. The chalcogenide may include a material of a germanium-antimony-tellurium (Ge—Sb—Te) ternary system. When the material of the Ge—Sb—Te ternary system includes a eutectic composition that has a low melting point, repeated thermal cycling of the material may result in a phase separation of the material of the Ge—Sb—Te ternary system. Such phase separation may result in deteriorated reliability of the seed layer pattern 138a. To improve the reliability of the seed layer pattern 138a, the seed layer pattern 138a may include a material of the Ge—Sb—Te ternary system that has a congruent composition whose melting point is substantially higher than that of the eutectic composition.

A Ge—Sb—Te material having a congruent composition may include a material of a GeTe—$Sb_2Te_3$ binary system. The material of the GeTe—$Sb_2Te_3$ binary system may include a compound of GeTe and $Sb_2Te_3$ as starting materials. For example, the material of the GeTe—$Sb_2Te_3$ binary system may include $Ge_2Sb_2Te_5$, $Ge_4Sb_2Te_7$, $Ge_1Sb_2Te_4$, $Ge_1Sb_4Te_7$, etc. These materials may be used alone or in a mixture thereof.

Although $Ge_{39}Sb_9Te_{52}$, which belongs to the Ge—Sb—Te ternary system, is not included in the GeTe—$Sb_2Te_3$ binary system, $Ge_{39}Sb_9Te_{52}$ has an FCC structure. Thus, seed layer pattern 138a may also include $Ge_{39}Sb_9Te_{52}$.

When the phase-changeable material layer pattern 140a has a uniform crystalline structure, for example, when the phase-changeable material layer pattern is formed with the aid of the seed layer pattern 138a, a reduced current may be applied to the phase-changeable memory device 1000 in a first firing step to initially activate the phase-changeable memory device 1000.

After the first firing step, an activation composition (not shown) may be generated at an interface between the seed layer pattern 138a and the phase-changeable material layer pattern 140a. This activation composition may include relatively large amounts of antimony (Sb) and/or tellurium (Te). Thus, when the seed layer pattern 138a has a composition similar or identical to the activation composition, the voltage applied to the phase-changeable memory device 1000 in the first firing step may be reduced. Accordingly, in some embodiments of the invention, the seed layer pattern 138a may include a composition that includes relatively large amounts of antimony and tellurium such as, for example, $Ge_1Sb_2Te_4$ or $Ge_1Sb_4Te_7$.

The seed layer pattern 138a, including the material of the GeTe—$Sb_2Te_3$ binary system, may be doped with impurities. The impurities may include nitrogen (N) and/or oxygen (O). These impurities can be used alone or in a mixture thereof. Alternatively or additionally, the impurities may include a transition metal such as cobalt (Co), iron (Fe) or manganese (Mn), etc., which may likewise be used alone or in a mixture thereof, or in a mixture with other impurities.

When the seed layer pattern 138a is doped with the impurities, the size of grains in the seed layer pattern 138a may decrease. A phase-changeable material layer pattern 140a having an FCC structure may be efficiently grown on the seed layer pattern 138a with the aid of the impurities. Additionally, the impurities may be segregated at grain boundaries of the seed layer pattern 138a so that the driving current may be reduced by the impurities. Furthermore, the impurities may generate defects in the seed layer pattern 138a, which may reduce the drive current.

In some embodiments of the invention, the seed layer pattern 138a may include an InGeSbTe compound or a GeSnSbTe compound, and/or a mixture of such compounds. Since the InGeSbTe compound and the GeSnSbTe compound have FCC structures, a phase-changeable material layer pattern 140a having an FCC structure may be efficiently grown on the seed layer pattern 138a when the seed layer pattern 138a includes an InGeSbTe compound or a GeSnSbTe compound.

In some embodiments of the invention, the seed layer pattern 138a may include GeN or InN and/or a mixture of such compounds. When the seed layer pattern 138a includes GeN or InN, the seed layer pattern 138a may have a thickness of less than about 50 Å. Thus, leakage current from the seed layer pattern 138a may be efficiently reduced.

The phase-changeable material layer pattern 140a may be formed on the seed layer pattern 138a. The phase-changeable material layer pattern 140a may include a chalcogenide. In particular, the phase-changeable material layer pattern 140a may include a material of a Ge—Sb—Te ternary system, a material of an Sn—Sb—Te ternary system, a material of an In—Sb—Te ternary system, and/or a material of an Sn—Sb—Ge ternary system, and/or a mixture of such materials.

In some embodiments of the invention, the phase-changeable material layer pattern 140a may include the material of the Ge—Sb—Te ternary system doped with impurities such as nitrogen and/or oxygen, which may be used alone or in a mixture thereof.

In some embodiments of the invention, the phase-changeable material layer pattern 140a may include a material of the Ge—Sb—Te ternary system doped with a transition metal.

The phase-changeable material layer pattern 140a may have a thickness of about 1,000 Å to about 2,000 Å. The phase-changeable material layer pattern 140a may advantageously include a material of the Ge—Sb—Te ternary system.

A conductive capping pattern 144a may be formed on the phase-changeable material layer pattern 140a. The conductive capping pattern 144a may have a single layer structure that includes a titanium layer, a titanium nitride layer and/or a composite layer of titanium and titanium nitride. Alternatively, the conductive capping pattern 144a may have a multi-layer structure that includes a first conductive capping pattern and a second conductive capping pattern formed on the first conductive capping pattern. When the first conductive capping pattern includes titanium, the second conductive capping pattern may include titanium nitride. On the other hand, when the first conductive capping pattern may include titanium nitride, the second conductive capping pattern may include titanium.

A second insulating interlayer 142 may be formed on the first insulating interlayer 130a to cover the seed layer pattern 138a, the phase-changeable material layer pattern 140a and the conductive capping pattern 144a.

An upper electrode 146 may be formed on the conductive capping pattern 144a through the second insulating interlayer 142 to make contact with the conductive capping pattern 144a.

An upper wiring pattern 148 may be formed on the upper electrode 146 and the second insulating interlayer 142 to make contact with the upper electrode 146.

FIGS. 2 to 10 are cross-sectional views illustrating methods of manufacturing phase-changeable memory devices in accordance with some embodiments of the invention.

Figure 2:
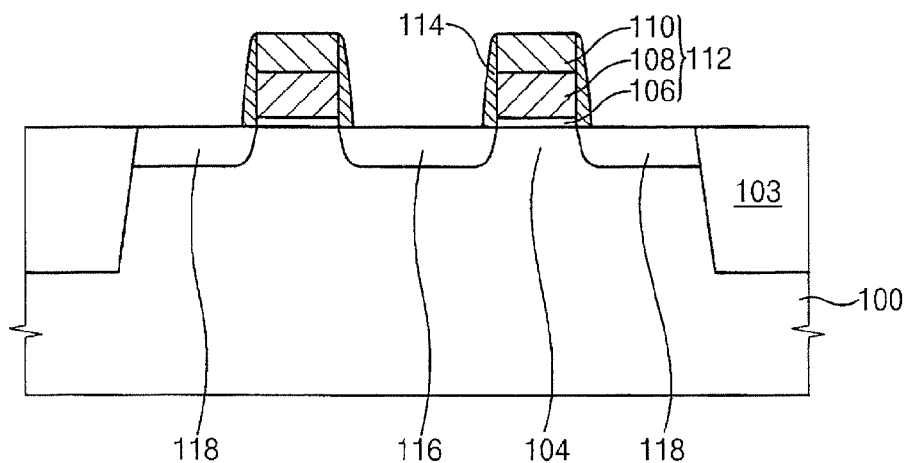
FIGS. 2 to 10 are cross-sectional views illustrating methods of forming phase-changeable memory devices in accordance with some embodiments of the invention.

Referring to the embodiments of FIG. 2, an isolation layer 103 may be formed on a substrate 100 by an isolation process such as, for example, an STI process or a local oxidation of silicon (LOCOS) process. The isolation layer 103 may define an active region 104 and a field region corresponding to the isolation layer 103.

A gate insulation pattern 106, a gate electrode 108 and a hard mask pattern 110 may be sequentially formed above the active region 104 of the substrate 100. Thus, a gate structure 112 including the gate insulation layer pattern 106, the gate electrode pattern 108 and the hard mask pattern 110 may be formed on the substrate 100.

A nitride layer (not shown) may be formed on the substrate 100 to cover the gate structure 112. The nitride layer may be anisotropically etched to form a gate spacer 114 on a sidewall of the gate structure 112. The gate electrode pattern 108 may have a single layer structure or a double layer structure. When the gate electrode pattern 108 has a single layer structure, the gate electrode pattern 108 may include a metal layer and/or a polysilicon layer doped with impurities. When the gate electrode pattern 108 has a double layer structure, the gate electrode pattern 108 may include a doped polysilicon layer and/ or one or more metal layers.

Impurities may be implanted into portions of the substrate 100 by an ion implantation process using the gate structure 112 as an ion implantation mask to thereby form a first contact region 116 (e.g., a source region) and a second contact region 118 (e.g., a drain region) at the portions of the substrate 100 exposed between the gate structures 112. As a result, a transistor including the first contact region 116, the second contact region 118 and the gate structure 112 may be formed on the substrate 100. The transistor may serve as a switching element for a unit cell of a phase-changeable memory device.

Figure 3:
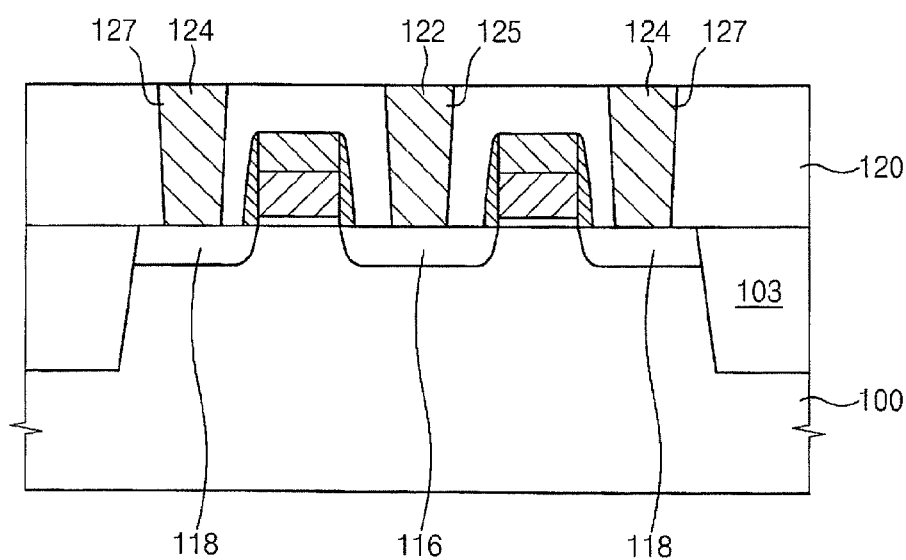

Referring to the embodiments of FIG. 3, a lower insulating interlayer 120 may be formed on the substrate 100 to cover the transistor structure defined by the first contact region 116, the second contact region 118, and the gate structure 112. The lower insulating interlayer 120 may be formed using an oxide such as TEOS, USG, SOG, HDP-CVD oxide, etc., and/or a mixture of two or more of such materials. In accordance with some embodiments of the invention, the lower insulating interlayer 120 may be planarized by a planarization process such as a chemical mechanical polishing (CMP) process, an etch-back process and/or a combination process of CMP and etch-back.

The lower insulating interlayer 120 may be partially etched using a photolithography process so that a first contact hole 125 and a second contact hole 127 are formed through the lower insulating interlayer 120. The first contact hole 125 may partially expose the first contact region 116, and the second contact hole 127 may partially expose the second contact region 118.

A first conductive layer (not shown) may be formed on the lower insulating interlayer 120 to fill up the first contact hole and the second contact hole. The first conductive layer may be partially removed by a CMP process, an etch-back process or a combination process of CMP and etch-back. In particular, the first conductive layer may be partially removed until the lower insulating interlayer 120 is exposed to form a first pad 122 and a second pad 124 in the first contact hole and the second contact hole, respectively. The first conductive layer may be formed using a conductive material such as a doped polysilicon, a metal, and/or a conductive metal nitride. For example, the conductive layer may be formed using copper, tantalum, tungsten, titanium, aluminum, titanium nitride, aluminum nitride, tungsten nitride, etc. These materials may be provided alone and/or in a mixture thereof.

Figure 4:
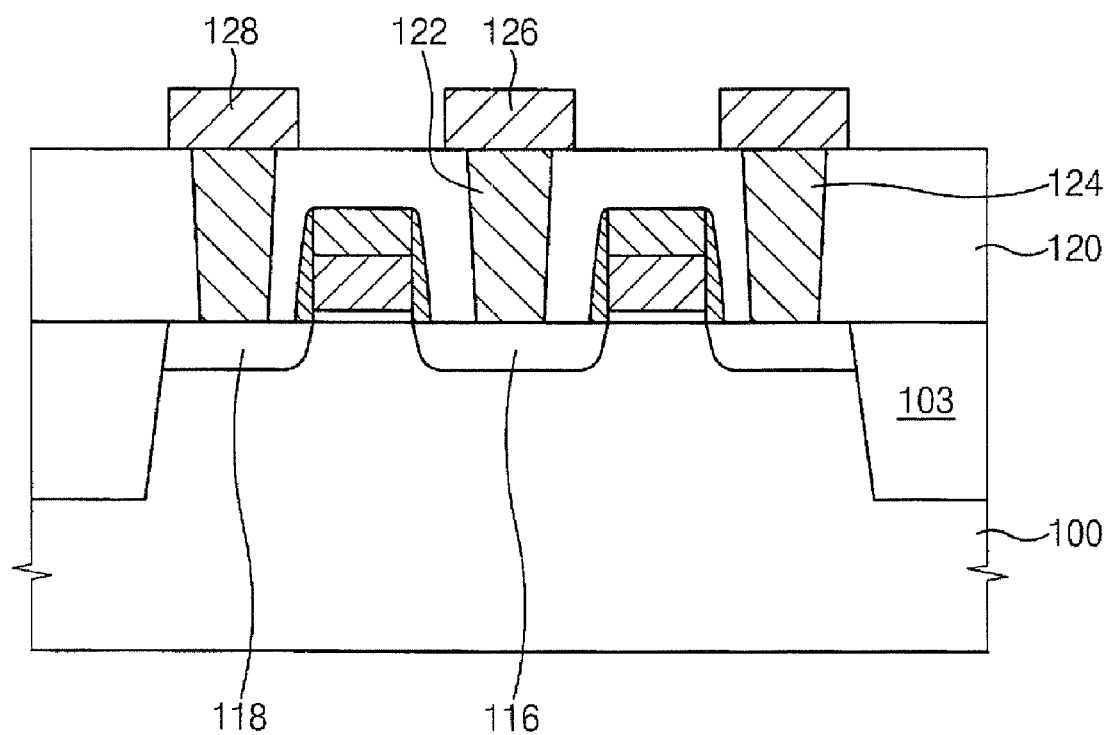

Referring to the embodiments of FIG. 4, a second conductive layer may be formed on the first pad 122, the second pad 124 and the lower insulating interlayer 120. The second conductive layer may be formed using a doped polysilicon, a metal, and/or a conductive metal nitride. In some embodiments of the invention, the second conductive layer may be formed using a conductive material similar or identical to that of the first conductive layer. In further embodiments of the invention, the second conductive layer may be formed using a conductive material substantially different from that of the first conductive layer.

The second conductive layer may be patterned to form a lower wiring pattern 126 and a conductive pattern 128. The lower wiring pattern 126 may be formed on the first pad 122, and the conductive pattern 128 may be positioned the second pad 124. That is, the lower wiring pattern 126 may make electrical contact with the first contact region 116 through the first pad 122, and the conductive pattern 128 may contact the second contact region 118 through the second pad 124.

In some embodiments of the invention, when the lower wiring pattern 126 and the conductive pattern 128 include copper, a damascene process may be performed for forming the lower wiring pattern 126 and the conductive pattern 128. That is, an additional insulating interlayer may be formed on the first pad 122, the second pad 124 and the lower insulating interlayer 120. Then, the additional insulating interlayer may be partially etched to form openings that expose the first pad 122 and the second pad 124. After a copper layer is formed on the additional insulating interlayer to fill up the openings, the copper layer may be removed, for example by a CMP process, until the additional insulating interlayer is exposed. Accordingly, the lower wiring pattern 126 and the conductive pattern 128 may be formed in the etched openings.

Figure 5:
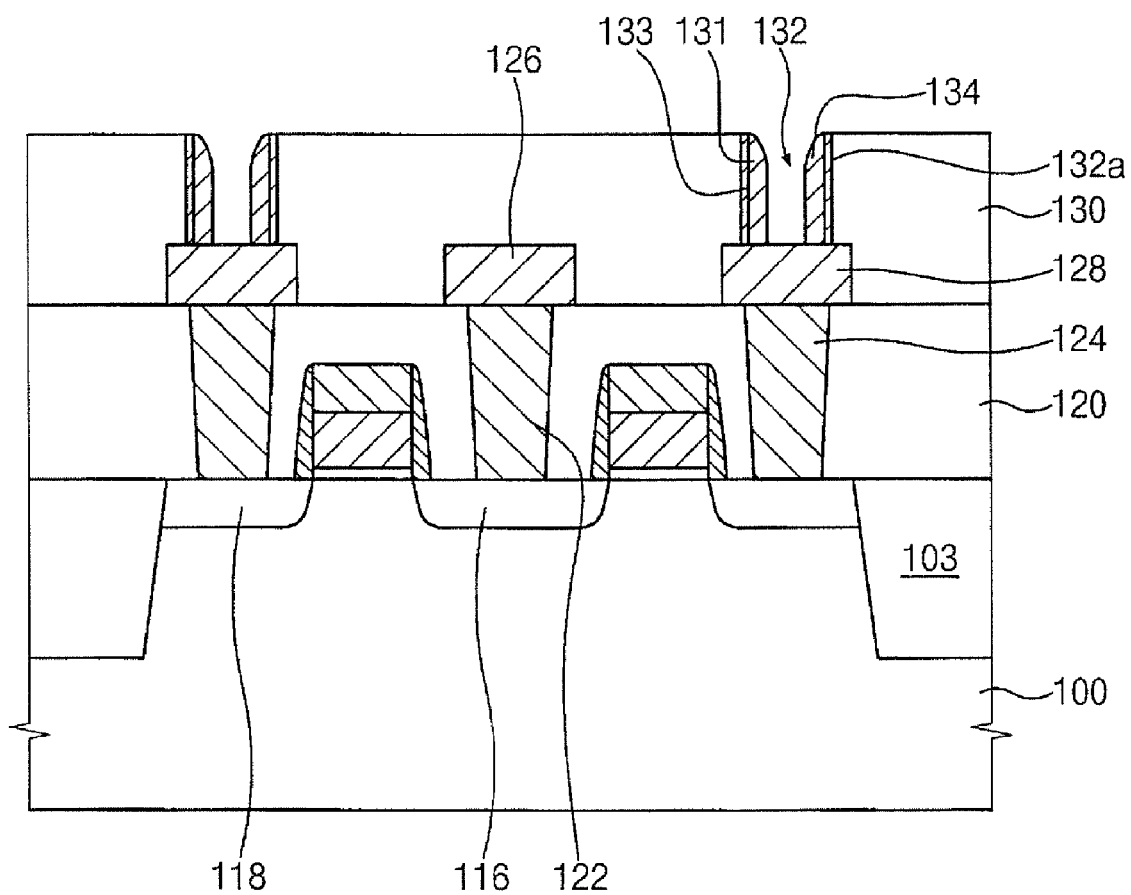

Referring to the embodiments of FIG. 5, a first preliminary insulating interlayer 130 may be formed on the lower insulating interlayer 120 to cover the lower wiring pattern 126 and the conductive pattern 128. The first preliminary insulating interlayer 130 may be formed using an oxide. For example, the first preliminary insulating interlayer 130 may be formed using TEOS, USG, SOG, HDP-CVD oxide, etc., and/or a combination of any of the foregoing. The first preliminary insulating interlayer 130 may be partially etched to thereby form a first opening 132 that exposes the conductive pattern 128.

An oxynitride layer 131 and a nitride layer 133 may be sequentially formed on the exposed conductive pattern 128, a sidewall 132a of the first opening 132 and the first preliminary insulating interlayer 130. The oxynitride layer 131 may be formed using silicon oxynitride, and the nitride layer may be formed using silicon nitride.

The nitride layer 133 and the oxynitride layer 131 may be anisotropically etched until the conductive pattern 128 and the first preliminary insulating interlayer 130 are exposed, thereby forming a preliminary spacer 134 on the sidewall 132a of the first opening 132. In the embodiments illustrated in FIG. 5, the preliminary spacer 134 has a double layer structure.

In some embodiments, when the preliminary spacer 134 is formed on the sidewall 132a of the first opening 132, the preliminary spacer 134 may reduce the width of the first opening 132. Thus, a preliminary lower electrode 136 formed in the first opening 132 may also have a reduced width.

If the first opening 132 were formed using a conventional photolithography process, the first opening 132 may not have a desired width due to resolution limitations of the photolithography process. However, in some embodiments of the invention, since the size of the first opening 132 is reduced with the formation of the preliminary spacer 134, a preliminary lower electrode 136 having a small width may be formed in the first opening 132.

When the preliminary lower electrode 136 has a desirably small size, a phase-changeable material layer pattern 140a (see FIG. 10) may also have a small programming region, so that the current required to induce phase changes in the programming region may be reduced. As discussed above, a phase-changeable memory device stores or erases data by means of a phase change of the phase-changeable material in the programming region. Thus, reducing the current required to effect phase changes in the phase-changeable material may reduce the current and/or power required to operate a PRAM device.

Figure 6:
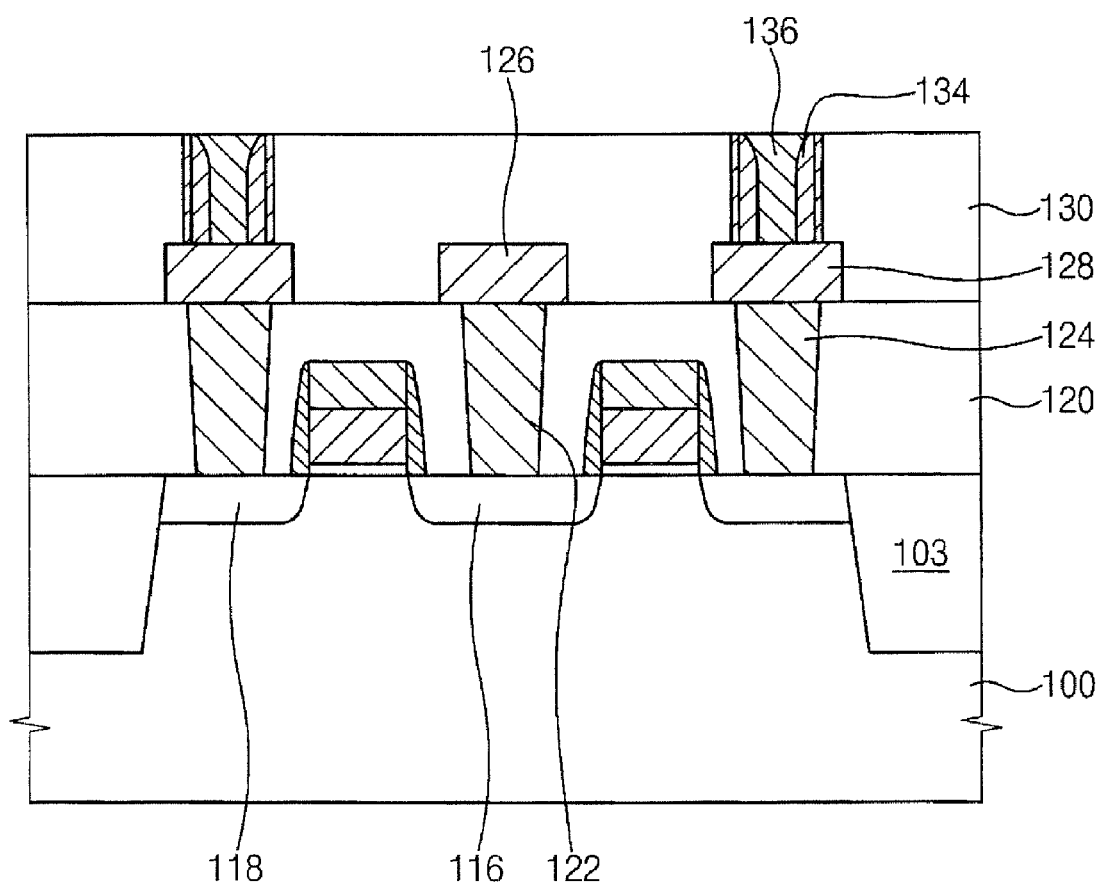

Referring to the embodiments of FIG. 6, a third conductive layer may be formed on the first preliminary insulating interlayer 130 to fill up the first opening 132. In some embodiments of the invention, the third conductive layer may be formed using a doped polysilicon. In further embodiments of the invention, the third conductive layer may be formed using a metal. For example, the third conductive layer may be formed using tantalum, copper, tungsten, titanium, aluminum, etc., either alone or in a mixture thereof. In still further embodiments of the invention, the third conductive layer may be formed using a conductive metal nitride such as a titanium nitride, tungsten nitride, aluminum nitride, titanium aluminum nitride, etc., either alone or in a mixture thereof.

The third conductive layer may be partially removed, for example, by a CMP process, an etch-back process or a combination process of CMP and etch-back. The third conductive layer may be partially removed until the first preliminary insulating interlayer 130 is exposed so that a preliminary lower electrode 136 may be formed in the first opening 132. The preliminary lower electrode 136 may be used to apply a Joule's heat to the phase-changeable material layer pattern 140a through the seed layer pattern 138a. Here, Joule's heat is generated from the preliminary electrode 136 when current is applied to the preliminary lower electrode 136.

When the preliminary lower electrode 136 is formed, surface portions of the preliminary lower electrode 136, the first preliminary insulating interlayer 130 and the preliminary spacer 134 are exposed. Since these surface portions may suffer damage in the process of forming the preliminary lower electrode 136, the surface portions of the preliminary lower electrode 136, the first preliminary insulating interlayer 130 and the preliminary spacer 134 may have irregular crystalline structures and irregular grain sizes.

Figure 7:
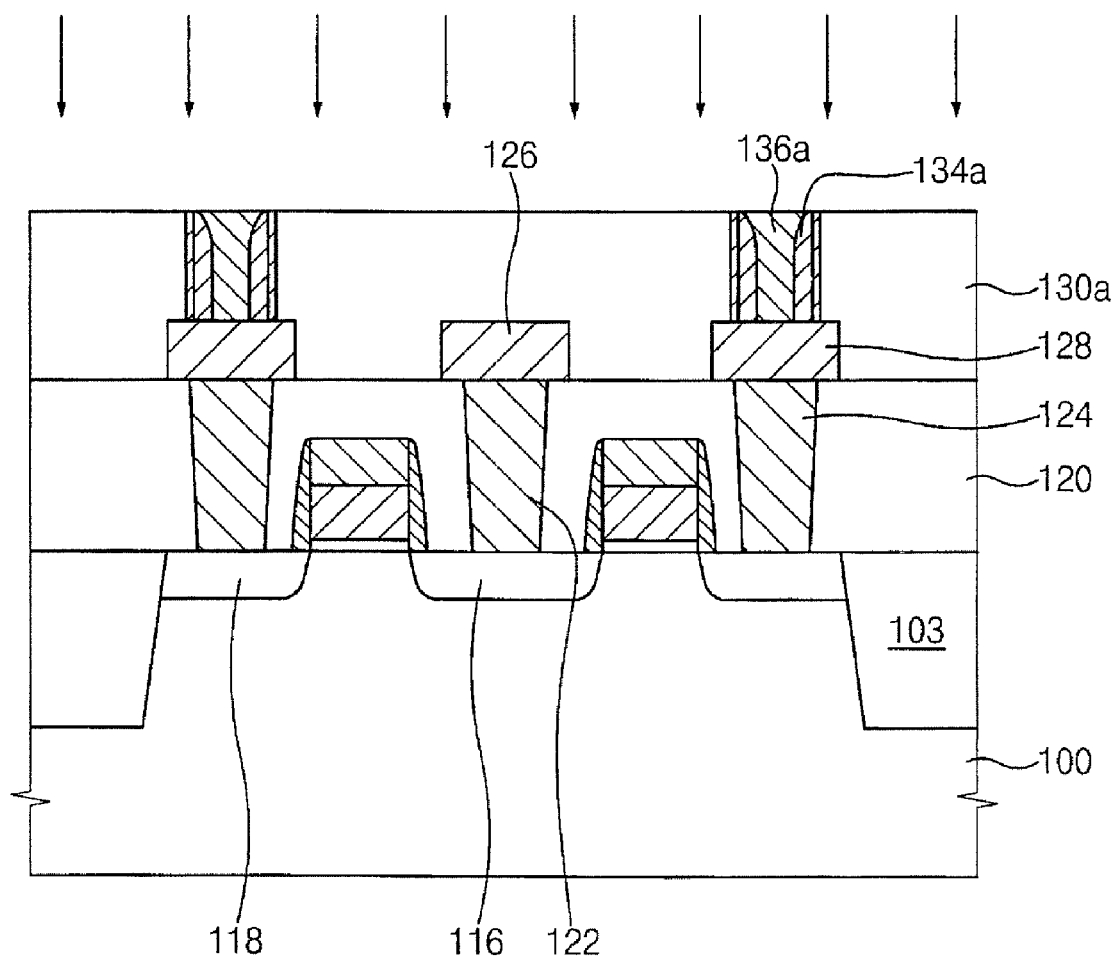

Referring to the embodiments of FIG. 7, the surface portions of the preliminary lower electrode 136, the first preliminary insulating interlayer 130 and the preliminary spacer 134 may be nitrided to thereby form a first insulating interlayer 130a, a spacer 134a and the lower electrode 136a. Since the first insulating interlayer 130a, the spacer 134a and the lower electrode 136a have the nitrided surface portions, a seed layer 138 and a phase-changeable material layer 140 having FCC structures may be easily formed on the first insulating interlayer 130a, the spacer 134a and the lower electrode 136a. In particular, the surface portions of the first insulating interlayer 130a, the spacer 134a and the lower electrode 136a may be nitrided by exposing them to nitrogen gas at a temperature of from about 200° C. to about 300° C. After the surface portions of the first insulating interlayer 130a, the spacer 134a and the lower electrode 136a are nitrided, the surface portion of the lower electrode 136a may include an N-rich conductive material. For example, the surface portion of the lower electrode 136a may include N-rich titanium nitride.

When the amount of nitrogen included in the surface portion of the lower electrode 136 increases, the electrical resistance of the surface portion of the lower electrode 136 may also increase. When the electrical resistance of the surface portion of the lower electrode 136 is above about 100 kΩ, it may be difficult to generate Joule's heat from the lower electrode 136. Thus, the electrical resistance of the surface portion of the lower electrode 136 may be maintained below about 100 kΩ by controlling the amount of nitrogen in the surface portion of the lower electrode 136 while nitriding the surface portion of the lower electrode 136.

The process of nitriding the preliminary lower electrode 136, the first preliminary insulating interlayer 130 and the preliminary spacer 134 will now be described in greater detail.

The crystalline structure and grain size of the phase-changeable material layer 140 may have a considerable effect on various characteristics of a phase-changeable memory device. In particular, the crystalline structure and the grain size in the programming region of the phase-changeable material layer 140 making contact with the lower electrode 136a may greatly affect on the characteristics of the phase-changeable memory device. When the grain size in the programming region is relatively large, the energy required for resetting the phase-changeable memory device may also be relatively large. That is, a relatively large current may be required for changing the phase of the phase-changeable material in the programming region. Thus, it may be advantageous for the grain size of the phase-changeable material in the programming region to be small.

When the phase-changeable material has a hexagonal close packed (HCP) crystalline structure, the phase-changeable material of the HCP crystalline structure may require a higher current to change the phase of the phase-changeable material in comparison with a phase-changeable material having the FCC structure. Therefore, it may be advantageous for the phase-changeable material to have an FCC structure with a small grain size.

When the phase-changeable material layer 140 has an irregular grain size and a mixed crystalline structure of FCC and HCP, the energies required for driving different unit cells may be substantially different from one another, so that the driving currents for the unit cells and the cell resistances may be irregular. Hence, the phase-changeable material layer 140 may have a substantially uniform grain size and a substantially uniform crystalline structure such as the FCC structure.

When the surface portions of the preliminary lower electrode 136, the first preliminary insulating interlayer 130 and the preliminary spacer 134 have substantially uniform crystalline structures and substantially uniform grain sizes, the seed layer 138 and the phase-changeable material layer 140 may be efficiently formed on the preliminary lower electrode 136, the first preliminary insulating interlayer 130 and the preliminary spacer 134, thereby forming the seed layer 138 and the phase-changeable material layer 140 with substantially uniform crystalline structures and substantially uniform grain sizes. However, since the preliminary lower electrode 136, the first preliminary insulating interlayer 130 and the preliminary spacer 134 include materials different from one another, the surface portions of the preliminary lower electrode 136, the first preliminary insulating interlayer 130 and the preliminary spacer 134 may not have uniform crystalline structures and grain sizes.

When the phase-changeable material layer 140 is formed on the first preliminary insulating interlayer 130 and the preliminary lower electrode 136, a first portion of the phase-changeable material layer 140 on the first preliminary insulating interlayer 130 may have a rapid formation rate and a large grain size in comparison with a second portion of the phase-changeable material layer 140 on the preliminary lower electrode 136. Additionally, the second portion of the phase-changeable material layer 140 on the preliminary lower electrode 136 may have a mixed crystalline structure of FCC and HCP. On the other hand, the first portion of the phase-changeable material layer 140 on the first preliminary insulating interlayer 130 may have a symmetrical FCC crystalline structure. Thus, after the surface portions of first preliminary insulating interlayer 130, the preliminary spacer 134 and the preliminary lower electrode 136 are nitrided, the seed layer 138 and the phase-changeable material layer 140 may be subsequently formed on the first insulating interlayer 130a, the spacer 134a and the lower electrode 136a. As a result, the seed layer 138 and the phase-changeable material layer 140 may have substantially uniform FCC crystalline structures. In addition, when the first insulating interlayer 130a, the spacer 134a and the lower electrode 136a may be damaged in the process for forming the preliminary lower electrode 136, the damage to the first insulating interlayer 130a, the spacer 134a and the lower electrode 136a may be cured by the nitration process.

Figure 8:
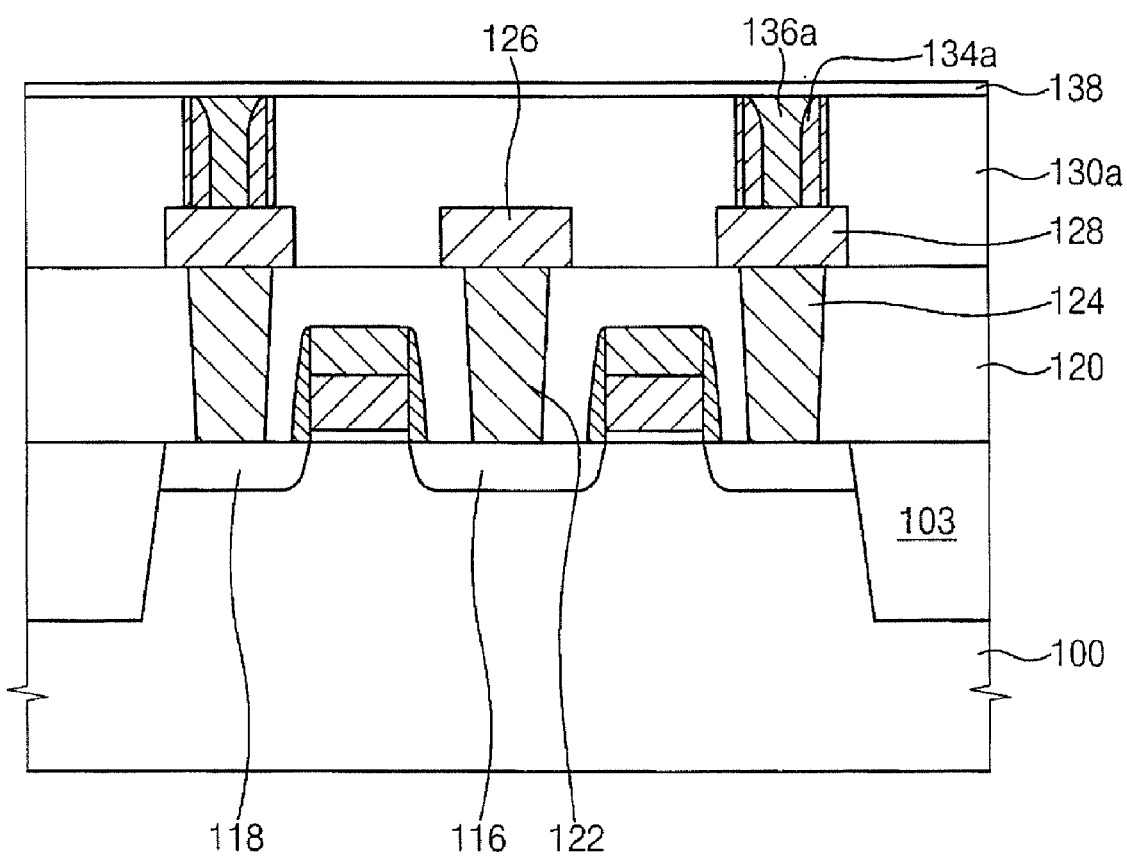

Referring to the embodiments of FIG. 8, the seed layer 138 may be formed on the first insulating interlayer 130a, the spacer 134a and the lower electrode 136a. Thus, the phase-changeable material layer 140 may be uniformly grown on the seed layer 138. The thickness of the seed layer 138 may be about 10 Å to about 100 Å.

The seed layer 138 may include a material from the Ge—Sb—Te ternary system. When the seed layer 138 includes elements such as germanium (Ge), antimony (Sb) or tellurium (Te), the elements in the seed layer 138 may be diffused and easily mixed one another at an interface between the seed layer 138 and the phase-changeable material layer 140, so that the phase-changeable material layer 140 may have poor characteristics. Thus, the seed layer 138 may include a material of the Ge—Sb—Te ternary system having a substantially congruent composition. The seed layer 138 may advantageously include a material of a GeTe—$Sb_2Te_3$ binary system in the Ge—Sb—Te ternary system.

As a phase-changeable memory device 1000 is repeatedly set and reset, the phase of the programming region of the phase-changeable material layer 140 may also be repeatedly charged. Thus, the reliability of the phase-changeable memory device may gradually decrease over time. In particular, when the phase-changeable material layer 140 has a eutectic composition with a low melting point, the reliability of the phase-changeable memory device 1000 may be rapidly decreased. Therefore, the seed layer 138 on which the phase-changeable material layer 140 may be formed to have a congruent composition. That is, the seed layer 138 may include a material of the GeTe—$Sb_2Te_3$ binary system belonging to the Ge—Sb—Te ternary system. The material of the GeTe—$Sb_2Te_3$ binary system may include $Ge_4Sb_2Te$=, $Ge_1Sb_2Te_4$, $Ge_1Sb_4Te_7$, etc., either used alone or in a mixture thereof.

After the first firing step for initializing the phase-changeable memory device 1000, a lower portion of the phase-changeable material layer pattern 140a may have an activation composition that includes relatively large amounts of antimony (Sb) and tellurium (Te). When the seed layer 138 has a composition substantially similar to the activation composition, the voltage applied to the phase-changeable memory device in the first firing step may be reduced. Thus, in some embodiments of the invention, the seed layer 138 may include Ge1Sb2Te4 and/or $Ge_1Sb_4Te_7$ that includes relatively large amounts of antimony and tellurium.

In some embodiments of the invention, the seed layer 138 may include $Ge_{37}Sb_9Te_{52}$, which also belongs to the Ge—Sb—Te ternary system. Since $Ge_{37}Sb_9Te_{52}$ has a substantially stable FCC crystalline structure, a phase-changeable material layer 140 having the FCC crystalline structure may be efficiently formed on the seed layer 138.

When the seed layer 138 includes a material of the GeTe—$Sb_2Te_3$ binary system or $Ge_{37}Sb_9Te_{52}$, the seed layer 138 may be doped with impurities such as nitrogen and/or oxygen. These can be used alone or in a mixture thereof. Alternatively or additionally, the impurities may include a transition metal.

When the seed layer 138 is doped with the impurities, the average grain size of the seed layer 138 may decrease. A phase-changeable material layer 140 having an FCC crystalline structure may be efficiently formed on the seed layer 138 with the aid of the impurities. Additionally, the impurities may become segregated at grain boundaries of the seed layer 138, so that the driving current for the programming region of the phase-changeable material layer pattern 140a may be reduced. Furthermore, the impurities may cause defects which may further reduce the driving current because the impurity-doped seed layer pattern 138a may be partially included in the programming region of the phase-changeable material layer pattern 140a.

In further embodiments of the invention, the seed layer 138 may include GeN or InN, either alone or in a mixture thereof. When the seed layer 138 includes GeN or InN, the thickness of the seed layer 138 may be in a range of about 10 Å to about 50 Å. Thus, leakage current from the seed layer 138 may be efficiently reduced.

In some embodiments of the invention, the seed layer 138 may include an InGeSbTe compound or a GeSnSbTe compound, either alone or in a mixture thereof. Since the InGeSbTe compound and the GeSnSbTe compound have stable FCC structures, a phase-changeable material layer 140 having an FCC structure may be efficiently grown on the seed layer 138.

Figure 9:
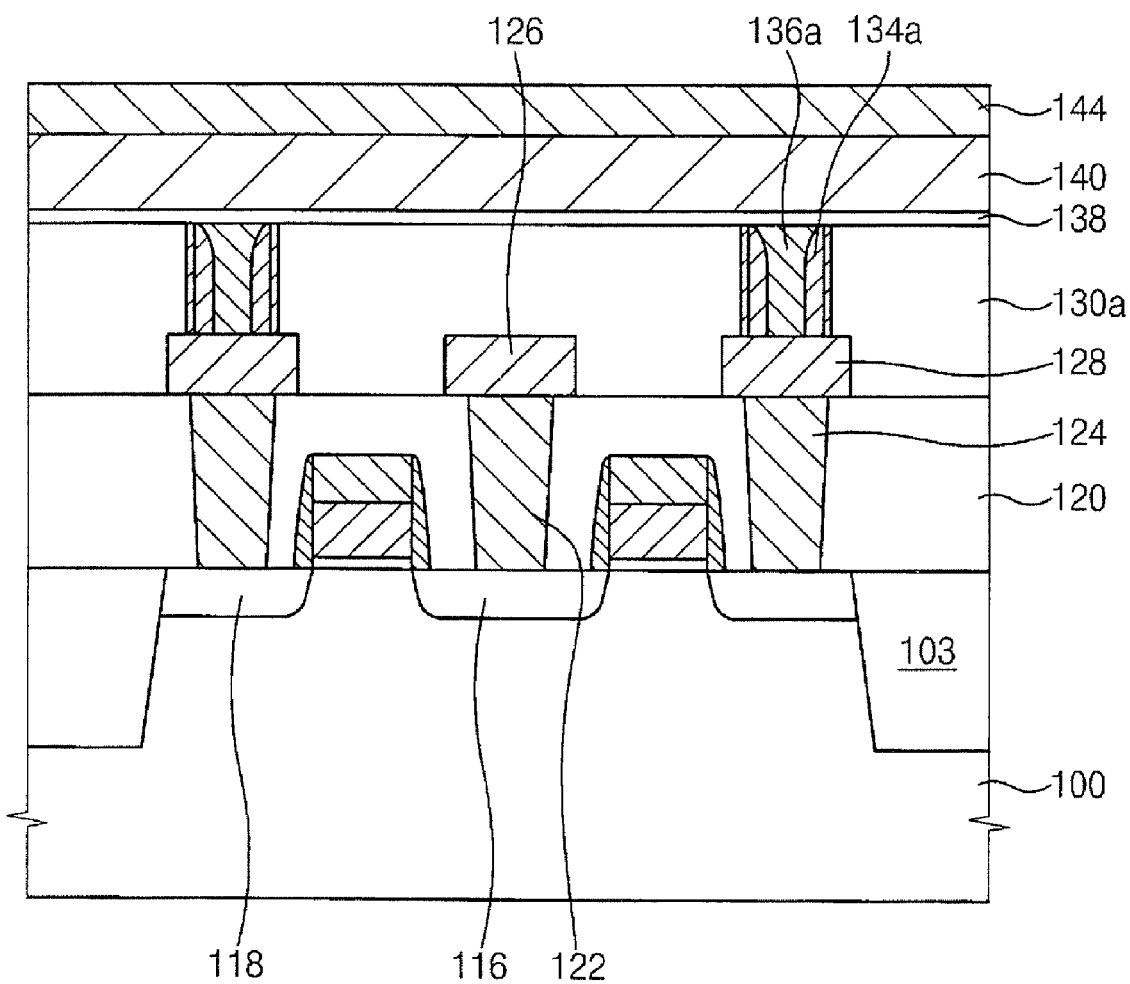

Referring to the embodiments of FIG. 9, the phase-changeable material layer 140 may be formed on the seed layer 138. The phase-changeable material layer 140 may include a chalcogenide. The phase-changeable material layer 140 may be formed, for example, by a sputtering process. The chalcogenide may include a material of a Ge—Sb—Te ternary system, an Sn—Sb—Te ternary system, an In—Sb—Te ternary system, and/or an Sn—Sb—Ge ternary system. These may be used alone or in a mixture thereof. For example, the phase-changeable material layer 140 may include the material of the Ge—Sb—Te ternary system. The phase-changeable material layer 140 may have a thickness of about 1,000 Å to about 2,000 Å.

In some embodiments of the invention, the phase-changeable material layer 140 including the chalcogenide may be doped with impurities such as oxygen and/or nitrogen.

A conductive capping layer 144 may be formed on the phase-changeable material layer 140. The conductive capping layer 144 may have a single layer structure or a double layer structure. When the conductive capping layer 144 has a single layer structure, the conductive capping layer 144 may include titanium, titanium nitride and/or a mixture thereof. When the conductive capping layer 144 has a double layer structure, the conductive capping layer 144 may include a first conductive capping layer and a second conductive capping layer formed on the first conductive capping layer. The first conductive capping layer and the second conductive capping layer may include titanium and a titanium nitride, respectively. Alternatively, the first conductive capping layer and the second conductive capping layer may include a titanium nitride and titanium, respectively.

Figure 10:
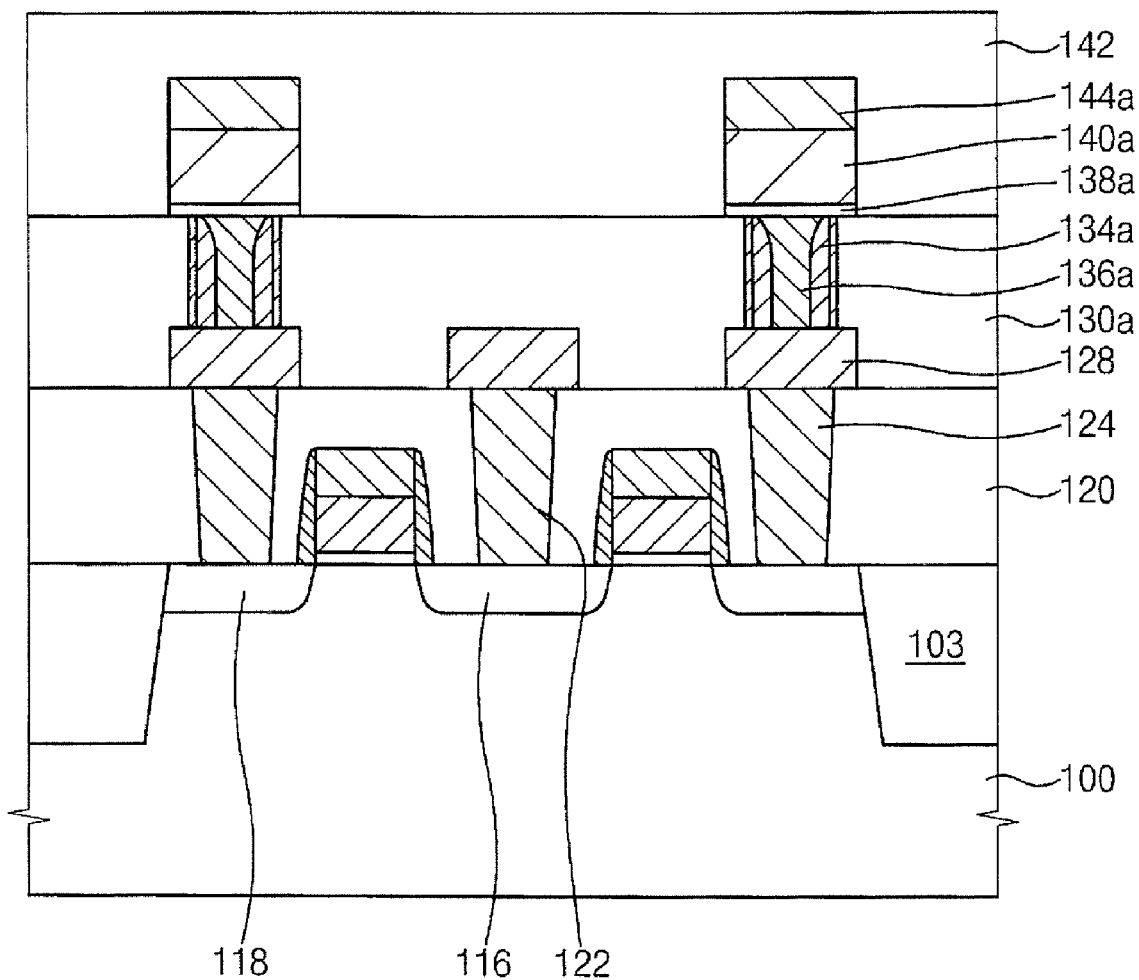

Referring to the embodiments of FIG. 10, the conductive capping layer 144, the phase-changeable material layer 140 and the seed layer 138 are partially etched to form a conductive capping pattern 144a, the phase-changeable material layer pattern 140a and the seed layer pattern 138a. The seed layer pattern 138a makes contact with the lower electrode 136a.

A second insulating interlayer 142 may be formed on the first insulating interlayer 130a to cover the conductive capping pattern 144a, the phase-changeable material layer pattern 140a and the seed layer pattern 138a.

Referring again to the embodiments of FIG. 1, the second insulating interlayer 142 may be partially etched to form a second opening 147 that exposes the conductive capping pattern 144a.

An additional conductive layer (not shown) may be formed on the second insulating interlayer 142 to fill up the second opening. The additional conductive layer may be partially removed until the second insulating interlayer 142 is exposed. Thus, an upper electrode 146 may be formed in the second opening. The additional conductive layer may be formed using a metal, a metal silicide and/or a conductive metal nitride. The conductive metal nitride may include titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, titanium oxynitride, titanium aluminum oxynitride, tungsten oxynitride, tantalum oxynitride, etc. These may be used alone or in a mixture thereof. The metal may include titanium, tungsten, molybdenum, tantalum, etc., either alone or in a mixture thereof. The metal silicide may include titanium silicide and/or tantalum silicide.

The additional conductive layer may include other suitable conductive materials having sufficient electrical conductivity.

An upper wiring pattern 148 is formed on the second insulating interlayer 142 and the upper electrode. The upper wiring pattern 148 makes contact with the upper electrode 146. Thus, a phase-changeable memory device 1000 is manufactured over the substrate 100.

As described above, the phase-changeable material layer pattern 140a of the phase-changeable memory device 1000 may have a substantially uniform FCC crystalline structure and a substantially uniform grain size. Therefore, the current required for changing the phase of the phase-changeable material in the phase-changeable material layer pattern 140a may be reduced so that the phase-changeable memory device may be operated with a substantially low voltage. Additionally, a seed layer pattern 138a may be formed between the phase-changeable material layer pattern 140a and the lower electrode 136a so that the crystalline structure of the programming region of the phase-changeable material layer pattern 140a may be more uniform, and also, grains included in the programming region may have more uniform sizes. As a result, the current applied to the phase-changeable memory device 1000 in the first firing step required for initially activating the phase-changeable memory device may be reduced. That is, the phase-changeable memory device may be activated with a lower current. Moreover, the phase-changeable memory device 1000 may be initially activated with a current having a similar magnitude as the current employed for reading data from the phase-changeable memory device 1000 and/or writing data into the phase-changeable memory device 1000.

Figure 11:
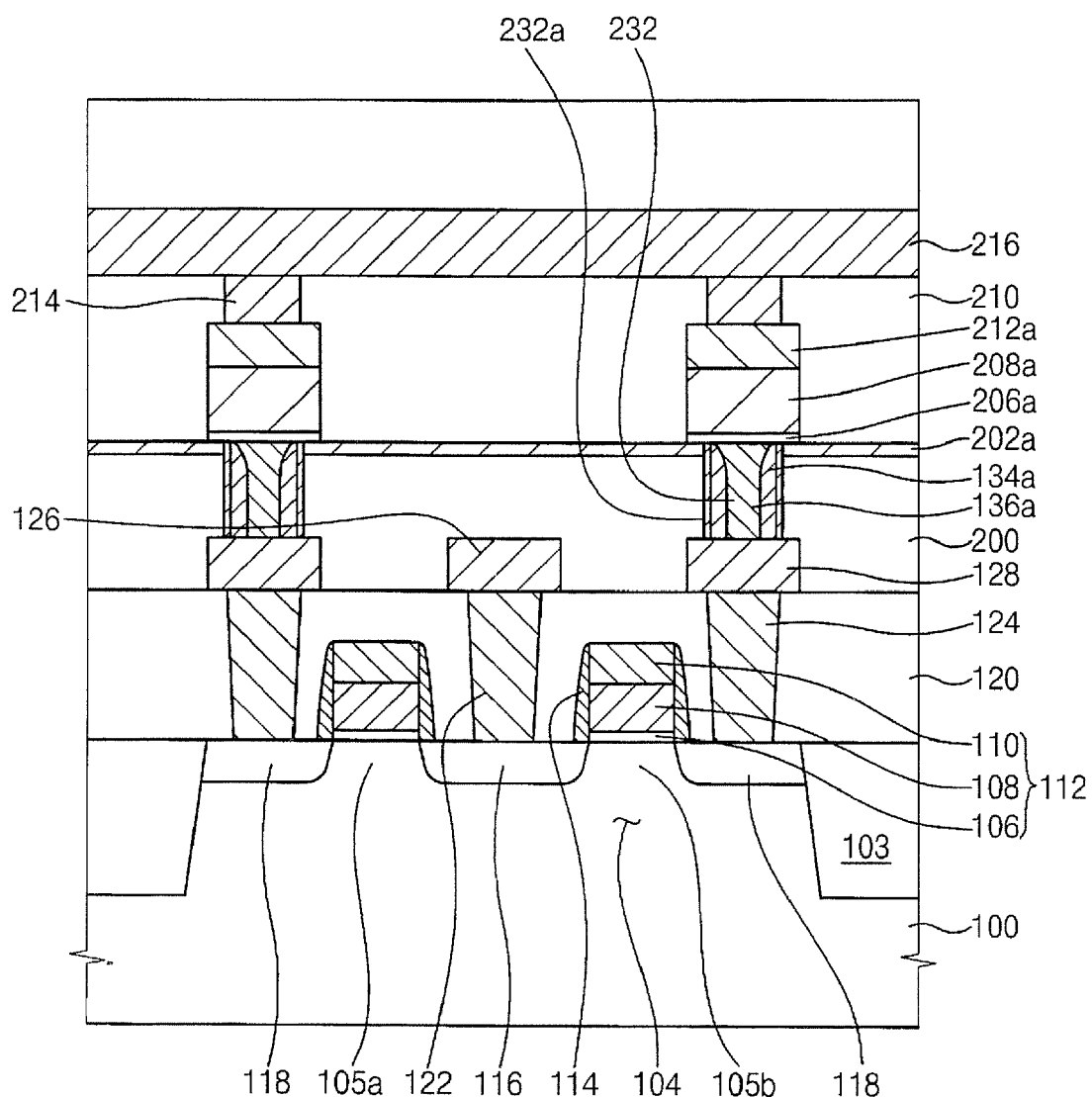
FIG. 11 is a cross-sectional view illustrating phase-changeable memory devices and associated methods in accordance with further embodiments of the invention.

FIG. 11 is a cross-sectional view illustrating a phase-changeable memory device 2000 in accordance with further embodiments of the invention.

Referring to FIG. 11, may be isolation layer 103 may be formed on a substrate 100 to define a field region and an active region 104. The isolation layer 103 may be formed, for example, by an STI process. At least one transistor 105a, 105b may be formed on the active region.

A lower insulating interlayer 120 may be formed on the substrate 100 and the isolation layer 103 to at least partially cover the transistor 105a, 105b. A first pad 122 may be formed through the lower insulating interlayer 120 to make contact with a first contact region 116. A second pad 124 may be formed through the lower insulating interlayer 120 to contact a second contact region 118.

The lower wiring pattern 126 may be formed on the first pad 122 so that the lower wiring pattern 126 may be electrically connected to the first contact region 116 through the first pad 122. The lower wiring pattern 126 may include a conductive material such as a doped polysilicon and/or a metal. For example, the lower wiring pattern 126 may include tungsten, aluminum, tantalum, titanium, copper, etc., either alone or in a mixture thereof. Since the electrical resistance of copper and/or tungsten is relatively low, the lower wiring pattern 126 may include copper and/or tungsten in some embodiments of the invention.

A conductive pattern 128 may be formed on the second pad 124 so that the conductive pattern 128 may be electrically connected to the second contact region 118 through the second pad 124. The conductive pattern 128 may include a conductive material similar to that of the lower wiring pattern 126.

A first insulation layer 200 may be formed on the lower insulating interlayer 120, the lower wiring 126 and the conductive pattern 128. The first insulating interlayer 200 may be formed using an oxide such as a silicon oxide.

A preliminary silicon nitride layer 202 may be formed on the first insulating interlayer 200. The preliminary silicon nitride layer 202 may have a thickness of about 50 Å to about 200 Å.

A material of a Ge—Sb—Te ternary system may be efficiently grown on the preliminary silicon nitride layer 202 to have a substantially uniform FCC crystalline structure. Thus, a seed layer 206 and a phase-changeable material layer 208 may be easily formed on the preliminary silicon nitride layer 202 rather than the first insulation layer 200. However, if only the preliminary silicon nitride layer 202 were formed instead of the first insulating interlayer 200, the preliminary silicon nitride layer 202 may not serve as a sufficient insulating interlayer in subsequent thermal processes, because the preliminary silicon nitride layer 202 have been a relatively low thermal resistance.

A first opening 232 may be formed through the preliminary silicon nitride layer 202 and the first insulating interlayer 200 to thereby expose the conductive pattern 128. The first opening may be formed by selectively etching the preliminary silicon nitride layer 202 and the first insulating interlayer 200.

A spacer 134a may be formed on a sidewall 232a of the first opening. The spacer 134a may decrease the width of the first opening 232. The spacer 134a may have a single layer structure that includes, for example, silicon nitride. Alternatively, the spacer 134a may have a double layer structure that includes a first layer 231 and a second layer 233 formed on the first layer. The first and the second layers may include, for example, silicon oxynitride and/or silicon nitride, respectively.

A lower electrode 136a may be formed in the first opening 232 so that the lower electrode 136a is connected to the conductive pattern 128. The lower electrode 136a may include a metal, a metal nitride and/or a doped polysilicon. For example, the lower electrode 136a may include tungsten, aluminum, tantalum, titanium, copper, titanium nitride, aluminum nitride, tungsten nitride, titanium aluminum nitride, etc., alone or in a combination thereof. Surface portions of the lower electrode 136a, the preliminary silicon nitride layer 202a and the spacer 134a may be nitrided.

A seed layer pattern 206a may be formed on the lower electrode 136a, the preliminary silicon nitride layer 202a and the spacer 134a. The seed layer pattern 206a may cover the lower electrode 136a. The seed layer pattern 206a may permit more a uniform crystalline growth of a phase-changeable material layer, which is patterned to form a phase-changeable material layer pattern 208a. The seed layer pattern 206a may have a thickness of about 10 Å to about 100 Å. The seed layer pattern 206a may include a chalcogenide based on a Ge—Sb—Te ternary material system. For example, the seed layer pattern 138a may include a material of the Ge—Sb—Te ternary system that has a congruent composition and having a melting temperature substantially higher than the minimum melting temperature of a eutectic composition. The material of the Ge—Sb—Te ternary system having a congruent composition may include, for example, a material of a GeTe—$Sb_2Te_3$ binary system. The material of the GeTe—$Sb_2Te_3$ binary system may include, for example, GeTe and $Sb_2Te_3$ as starting materials. Thus, the material of the GeTe—$Sb_2Te_3$ binary system may include $Ge_2Sb_2Te_5$, $Ge_4Sb_2Te_7$, $Ge_1Sb_2Te_4$, $Ge_1Sb_4Te_7$, etc., either alone or in a mixture thereof. For example, the seed layer pattern 206a may include $Ge_1Sb_2Te_4$ and/or $Ge_1Sb_4Te_7$.

In some embodiments of the invention, the seed layer pattern 206a may include $Ge_{39}Sb_9Te_{52}$. Although $Ge_{39}Sb_9Te_{52}$ does not belong to the GeTe—$Sb_2Te_3$ binary system, $Ge_{39}Sb_9Te_{52}$ does belong to the Ge—Sb—Te ternary system and $Ge_{39}Sb_9Te_{52}$ may have a stable FCC crystalline structure.

In some embodiments of the invention, the seed layer pattern 206a may include a material of the GeTe—$Sb_2Te_3$ binary system doped with impurities such as nitrogen and/or oxygen, either alone or in a mixture thereof.

In further embodiments of the invention, the seed layer pattern 206a may include GeTe—$Sb_2Te_3$ or a mixture thereof. In some example embodiments, the seed layer pattern 206a may include the material of the GeTe—$Sb_2Te_3$ binary system doped with impurities such as a transition metal.

In still further embodiments of the invention, the seed layer pattern 206a may include an InGeSbTe compound or a GeSnSbTe compound, either alone or in a mixture thereof.

In yet further embodiments of the invention, the seed layer pattern 206a may include GeN and/or InN, either alone or in a mixture thereof. When the seed layer pattern 206a includes GeN and/or InN, the seed layer pattern 206a may have a thickness of below about 50 Å. Thus, leakage current from the seed layer pattern 206a may be efficiently reduced.

A phase-changeable material layer pattern 208a may be formed on the seed layer pattern 206a. The phase-changeable material layer pattern 208a may include a chalcogenide. The phase-changeable material layer pattern 208a may include a material of the Ge—Sb—Te ternary system, the Sn—Sb—Te ternary system, the In—Sb—Te ternary system and/or a Sn—Sb—Ge ternary system, either alone or in a mixture thereof. For example, the phase-changeable material layer pattern 208a may include a material of the Ge—Sb—Te ternary system.

The phase-changeable material layer pattern 208a may be doped with nitrogen, oxygen and/or a transition metal, either alone or in a mixture thereof.

A conductive capping pattern 212a may be formed on the phase-changeable material layer pattern 208a.

A second insulating interlayer 210 may be formed on the preliminary silicon nitride layer 202a to cover the seed layer pattern 206a, the phase-changeable material layer pattern 208a and the conductive capping pattern 212a.

An upper electrode 214 may be formed on the conductive capping pattern 212a through the second insulating interlayer 210. An upper wiring pattern 216 may be formed on the upper electrode 214 and the second insulating interlayer 210. The upper wiring 216 may be connected to the upper electrode 214.

FIGS. 12 to 18 are cross-sectional views illustrating methods of forming a phase-changeable memory device 2000 in accordance with some embodiments of the invention.

A phase-changeable memory device 2000 may be manufactured by processes similar or identical to those described in connection with the embodiments of FIGS. 2 to 10 except for the formation a silicon nitride layer.

Figure 12:
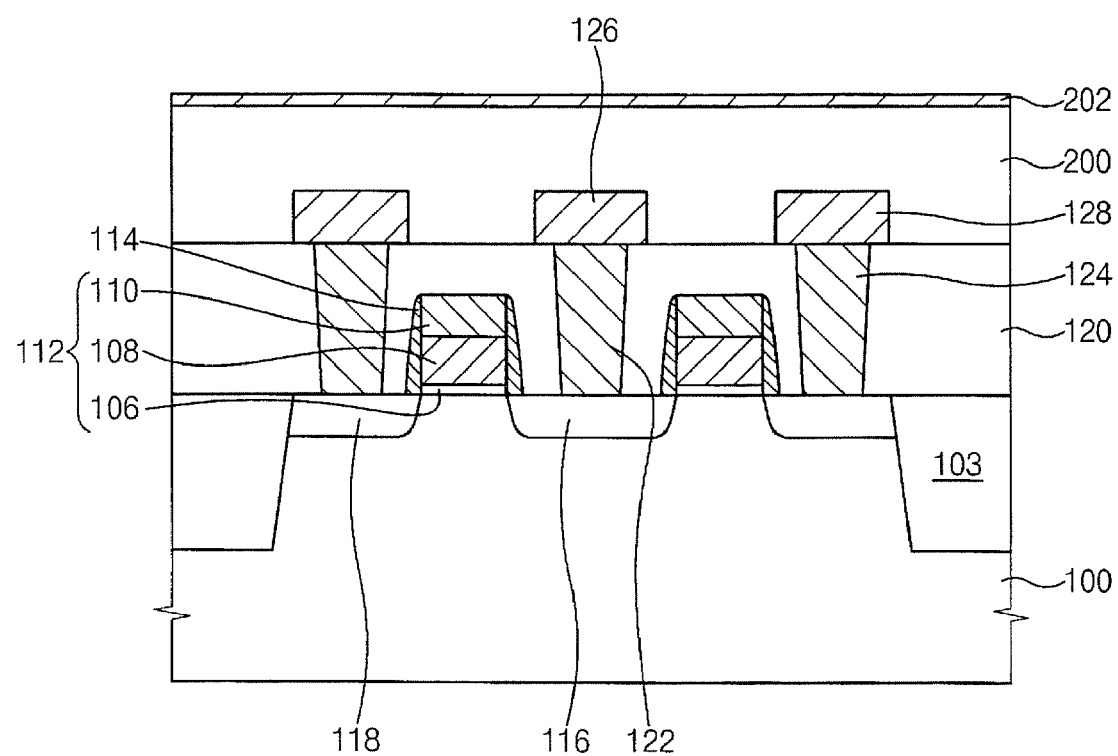
FIGS. 12 to 18 are cross-sectional views illustrating methods of manufacturing phase-changeable memory devices in accordance with further embodiments of the invention.

Referring to the embodiments of FIG. 12, an isolation layer 103, a gate insulation pattern 106, a gate electrode 108 and a hard mask pattern 110, a gate spacer 114, a first source/drain region 116, a second source/drain region 118, a lower insulating interlayer 120, a first pad 122, a second pad 124, a lower wiring 126 and a conductive pattern 128 may be formed on a substrate 100 by processes similar or identical to those described with reference to FIGS. 2 to 4.

A first insulating interlayer 200 may be formed on the lower insulating interlayer 120 to cover the lower wiring pattern 126 and the conductive pattern 128. The first insulating interlayer 200 may be formed using an oxide such as TEOS, USG, SOG, HDP-CVD oxide, etc., either alone or in a mixture thereof.

A preliminary silicon nitride layer 202 may be formed on the first insulating interlayer 200.

Figure 13:
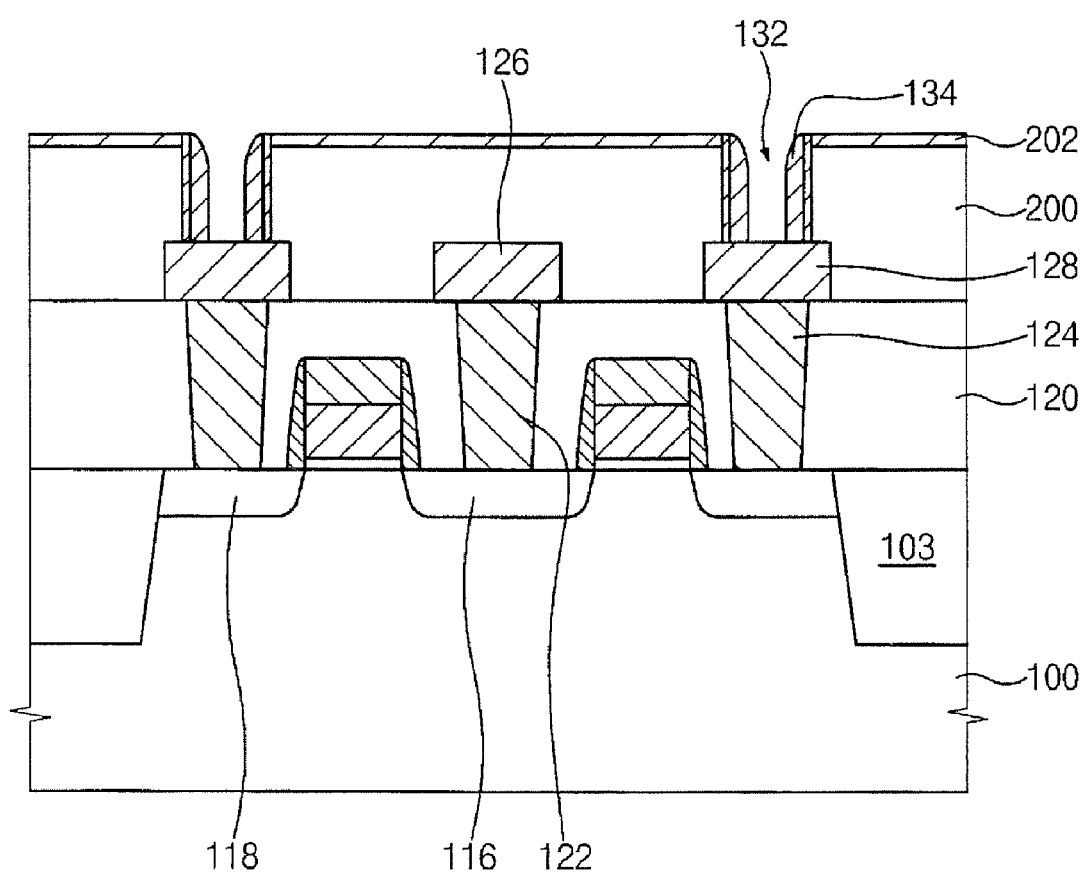

Referring to the embodiments of FIG. 13, the preliminary silicon nitride layer 202 and the first insulating interlayer 200 may be partially etched to form a first opening 132 that partially exposes the conductive pattern 128.

A silicon oxynitride layer (not shown) may be formed on the preliminary silicon nitride layer 202, a sidewall of the first opening 132 and the conductive pattern 128. A silicon nitride layer (not shown) may be formed on the silicon oxynitride layer. The silicon oxynitride layer and the silicon nitride layer may be anisotropically etched until the conductive pattern 128 is exposed so that a preliminary spacer 134 may be formed on the sidewall of the first opening 132. Thus, the preliminary spacer 134 may have a double layer structure.

In some embodiments of the invention, a silicon oxynitride layer is formed on the preliminary silicon nitride layer 202, a sidewall of the first opening 132 and the conductive pattern 128 without the formation of the silicon nitride layer. The silicon oxynitride layer may be anisotropically etched to thereby form a preliminary spacer 134 having a single layer structure.

In further embodiments of the invention, a silicon nitride layer may be formed on the preliminary silicon nitride layer 202, a sidewall of the first opening 132 and the conductive pattern 128 without the formation of a silicon oxynitride layer. The silicon nitride layer may be anisotropically etched to thereby form the preliminary spacer 134 having a single layer structure.

Figure 14:
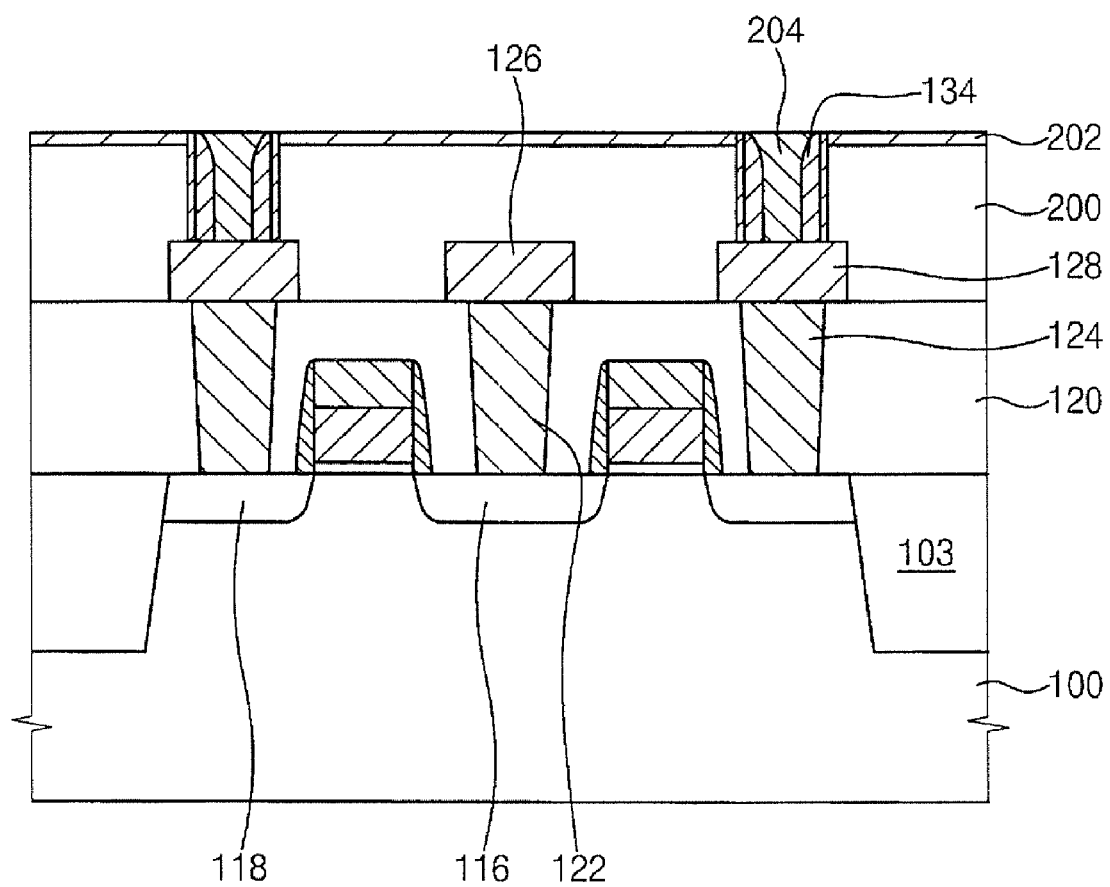

Referring to the embodiments of FIG. 14, a third conductive layer (not shown) may be formed on the preliminary silicon nitride layer 202 to fill up the first opening 132. The third conductive layer may be formed using, for example, a doped polysilicon. Alternatively or additionally, the third conductive layer may be formed using a metal and/or a conductive metal nitride. For example, the third conductive layer may be formed using tantalum, copper, tungsten, titanium, aluminum, titanium nitride, aluminum nitride, tungsten nitride, etc., either alone or in a mixture thereof.

The third conductive layer may be planarized, for example, by a planarization process such as a CMP process, an etch-back process or a combination process of CMP and etch-back. The planarization process may be performed until the silicon nitride layer 202 is exposed so that a preliminary lower electrode 204 may be formed in the first opening 132.

Figure 15:
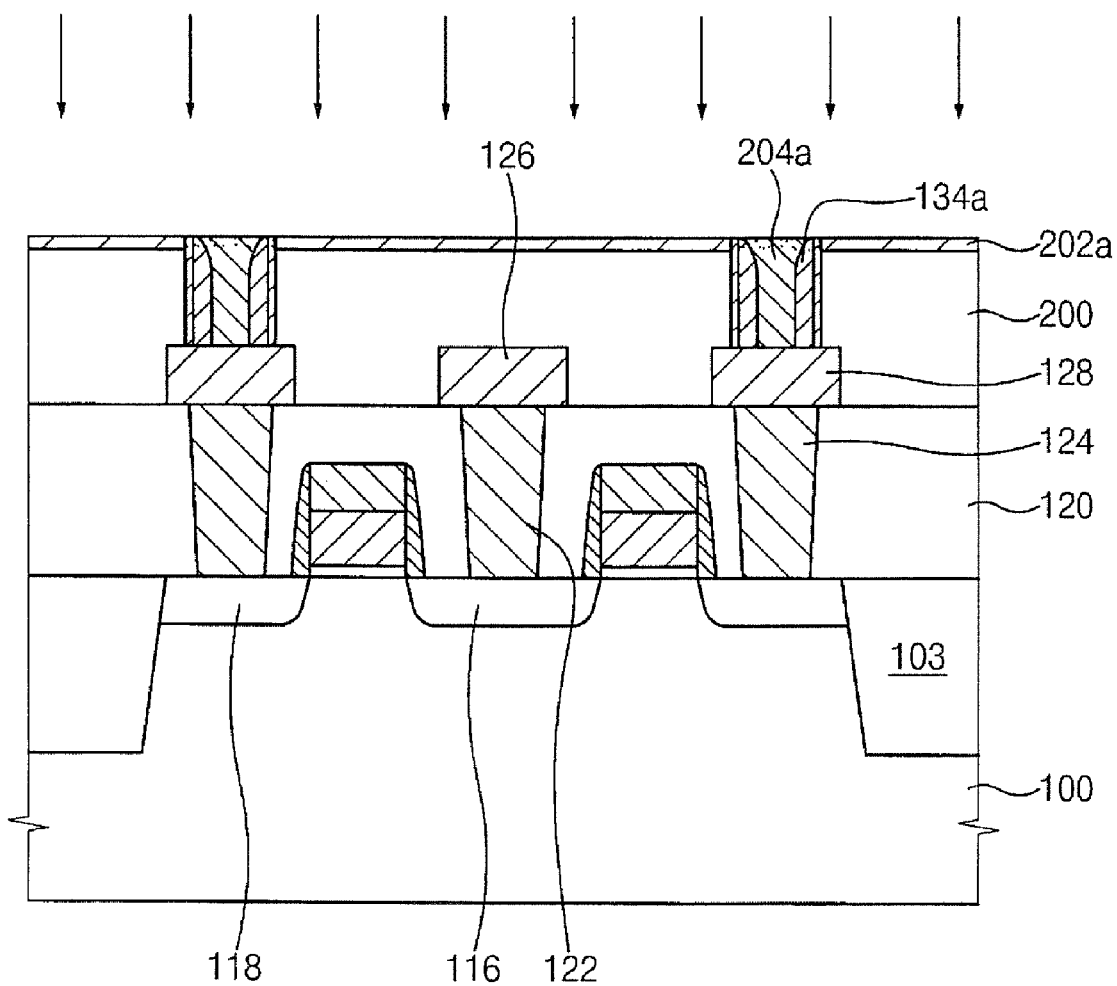

Referring to the embodiments of FIG. 15, surface portions of the preliminary silicon nitride layer 202, the preliminary lower electrode 204 and the preliminary spacer 134 may be nitrided so that surface portions of the preliminary silicon nitride layer 202, the preliminary lower electrode 204 and the preliminary spacer 134 may be converted into a silicon nitride layer 202a, a lower electrode 204a and a spacer 134a, respectively. The silicon nitride layer 202a, the lower electrode 204a and the spacer 134a may include a relatively large amount of nitrogen. In particular, the silicon nitride layer 202a may include more nitrogen than the preliminary silicon nitride layer 202.

Since the surface portions of the preliminary silicon nitride layer 202, the preliminary lower electrode 204 and the preliminary spacer 134 are nitrided, a phase-changeable material layer having an FCC crystalline structure may be formed more easily thereon. In particular, the surface portions of the preliminary silicon nitride layer 202, the preliminary lower electrode 204 and the preliminary spacer 134 may be nitrided by using a nitrogen gas at a temperature of about 200 to about 300° C. The electrical resistance of the surface portion of the lower electrode 204a may be maintained below about 100 kΩ by precisely controlling the amount of nitrogen included in the surface portion of the lower electrode 204a while nitriding the surface portion of the preliminary lower electrode 204.

As described above, since the surface portions of the preliminary silicon nitride layer 202, the preliminary lower electrode 204 and the preliminary spacer 134 may be nitrided, a seed layer 206 (see FIG. 16) and a phase-changeable material layer 208 (see FIG. 18) having FCC crystalline structures may be efficiently formed on the silicon nitride layer 202a, the lower electrode 204a and the spacer 134a. In addition, the grain sizes of the seed layer 206 and the phase-changeable material layer 208 may become more uniform.

Since the silicon nitride layer 202a may be formed on the first insulating interlayer 202, the seed layer 206 and the phase-changeable material layer 208 may not be formed directly on the first insulating interlayer 202 of silicon oxide. That is, the seed layer 206 and the phase-changeable material layer 208 may be formed on the silicon nitride layer 202a. Thus, the seed layer 206 and the phase-changeable material layer 208 subsequently formed on the silicon nitride layer 202a may include crystal grains having substantially uniform sizes. Additionally, the seed layer 206 and the phase-changeable material layer 208 may have substantially uniform crystalline structures.

When the silicon nitride layer 202a is formed on the first insulating interlayer 200, the nitration process may be omitted for simplifying the manufacturing processes for the phase-changeable memory device 2000.

Figure 16:
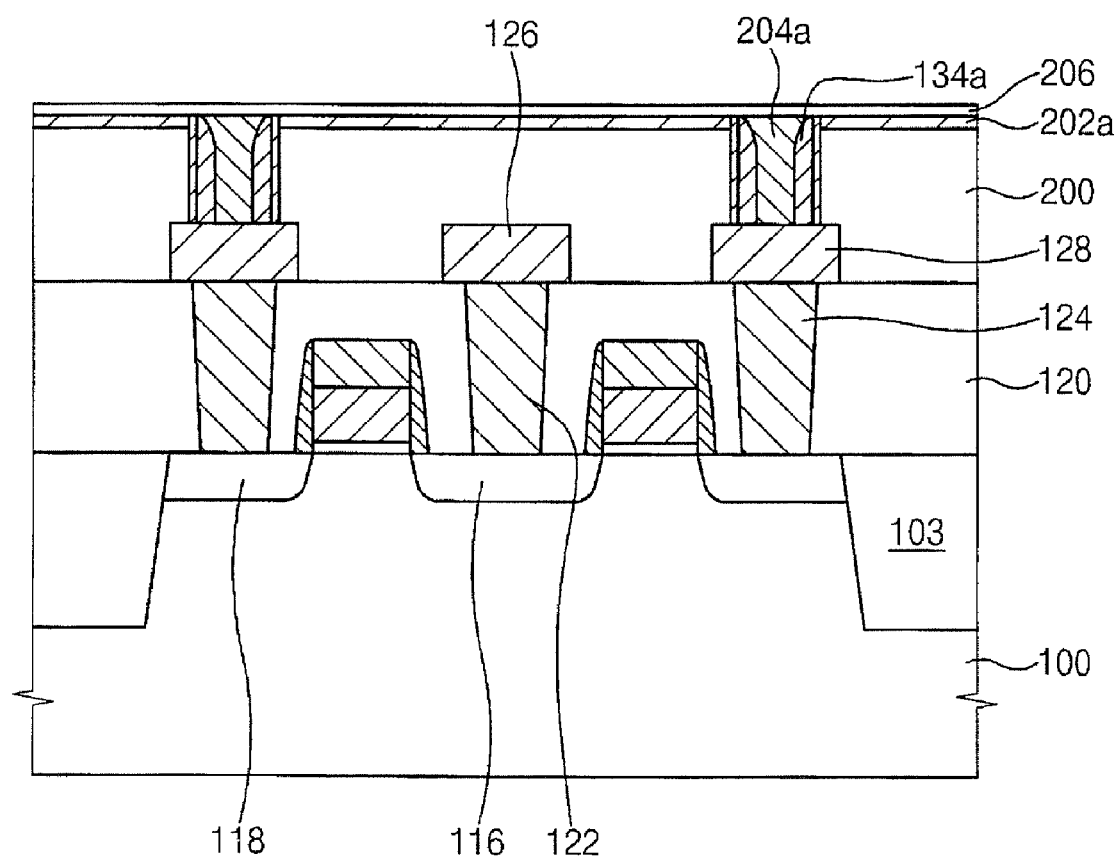

Referring to the embodiments of FIG. 16, the seed layer 206 may be formed on the silicon nitride layer 202a and the lower electrode 136a. The seed layer 206 may facilitate the crystalline growth of the phase-changeable material in the phase-changeable material layer 208 so that the phase-changeable material layer 208 may have a more uniform FCC crystalline structure. The seed layer 206 may have a thickness of about 10 Å to about 100 Å.

The seed layer 206 may be formed using a material of the Ge—Sb—Te ternary system. For example, the seed layer 206 may be formed using a material of the GeTe—$Sb_2T_3$ binary system having a congruent composition. The material of the GeTe—$Sb_2T_3$ binary system belongs to the Ge—Sb—Te ternary system. The material of the GeTe—$Sb_2T_3$ binary system may include $Ge4Sb_2Te_7$, $Ge_1Sb_2Te_4$ and/or $Ge_1Sb_4Te_7$, either alone or in a mixture thereof. For example, the seed layer 206 may include $Ge_1Sb_2Te_4$ and/or $Ge_1Sb_4Te_7$. These can be used alone or in a mixture thereof.

In some embodiments of the invention, the seed layer 206 may include $Ge_{37}Sb_9Te_{52}$. $Ge_{37}Sb_9Te_{52}$ belongs to the Ge—Sb—Te ternary material system. Since $Ge_{37}Sb_9Te_{52}$ has an FCC crystalline structure, the phase-changeable material layer 208 may be efficiently grown on the seed layer 206 when the seed layer 206 includes $Ge_{37}Sb_9Te_{52}$.

In further embodiments of the invention, the seed layer 206 may include a material of the GeTe—$Sb_2T_3$ binary system doped with impurities such as nitrogen and/or oxygen, and/or the $Ge_{37}Sb_9Te_{52}$ doped with impurities such as nitrogen and/or oxygen. These can be used alone or in a mixture thereof.

In still further embodiments of the invention, the seed layer 206 may include a material of the GeTe—$Sb_2Te_3$ binary system doped with impurities such as a transition metal and/or $Ge_{37}Sb_9Te_{52}$ doped with impurities such as a transition metal.

In yet further embodiments of the invention, the seed layer 206 may include GeN and/or InN, either alone or in a mixture thereof. When the seed layer pattern 206 includes GeN or InN, the seed layer 206 may have a thickness of about 10 Å to about 50 Å. Thus, leakage current from the seed layer 206 may be efficiently reduced.

In further embodiments of the invention, the seed layer 206 may include an InGeSbTe compound and/or a GeSnSbTe compound, either alone or in a mixture thereof. Since the InGeSbTe compound and the GeSnSbTe compound have substantially stable FCC crystalline structures, a phase-changeable material layer 208 having an FCC crystalline structure may be efficiently grown on the seed layer 206.

Figure 17:
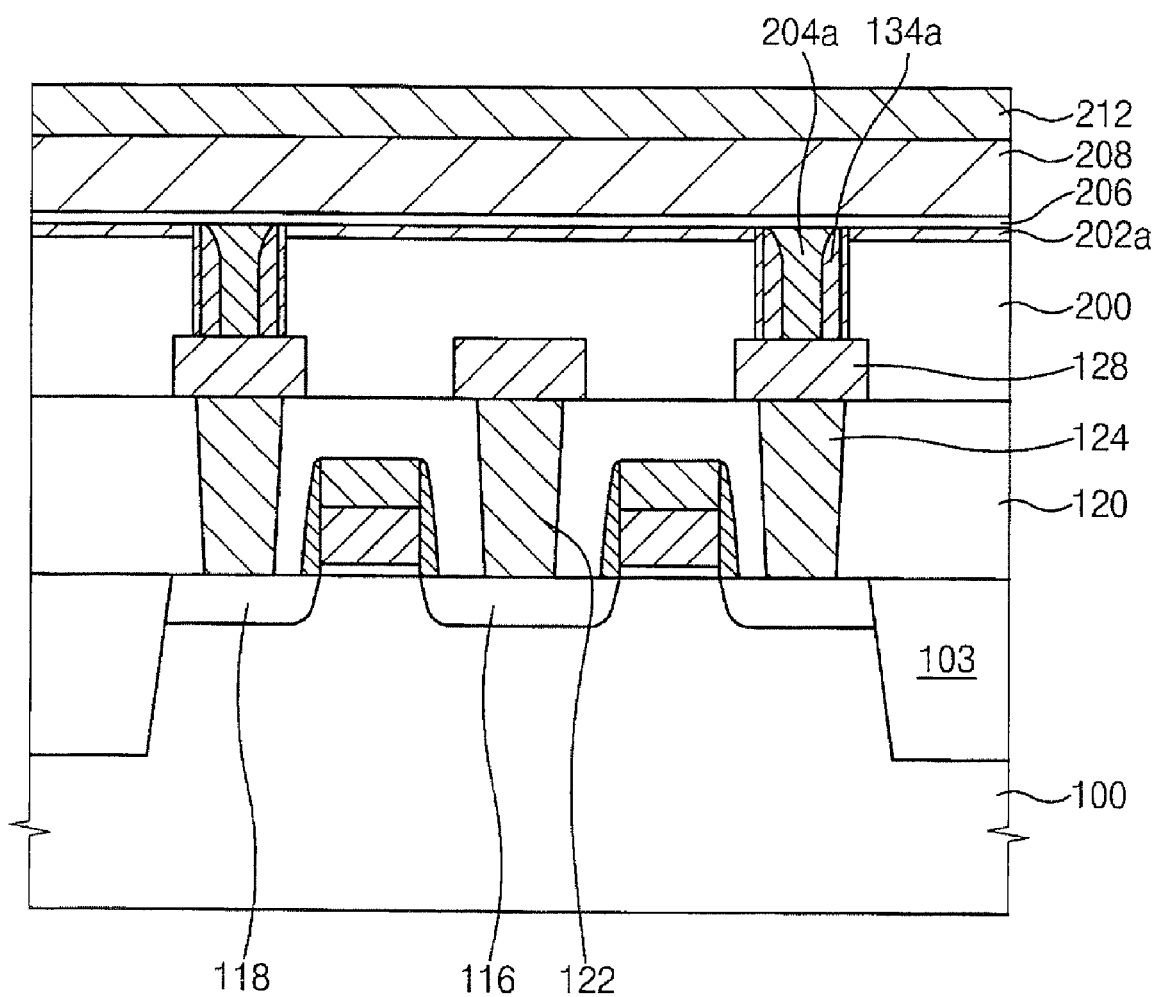

Referring to the embodiments of FIG. 17, the phase-changeable material layer 208 may be formed on the seed layer 206. The phase-changeable material layer 208 may be formed using, for example, a chalcogenide. The phase-changeable material layer 208 may be formed, for example, by a sputtering process. The chalcogenide may include a material of a Ge—Sb—Te ternary system, an Sn—Sb—Te ternary system, an In—Sb—Te ternary system and/or an Sn—Sb—Ge ternary system, either alone or in a mixture thereof.

In some embodiments of the invention, the phase-changeable material layer 208 may include a chalcogenide doped with impurities such as oxygen and/or nitrogen, either alone or in a mixture thereof.

In further embodiments of the invention, the phase-changeable material layer 208 may include a chalcogenide doped with impurities such as a transition metal.

The phase-changeable material layer 208 may advantageously include the material of the Ge—Sb—Te ternary system. The phase-changeable material layer 208 may have a thickness of about 1,000 Å to about 2,000 Å.

A conductive capping layer 212 may be formed on the phase-changeable material layer 208.

Figure 18:
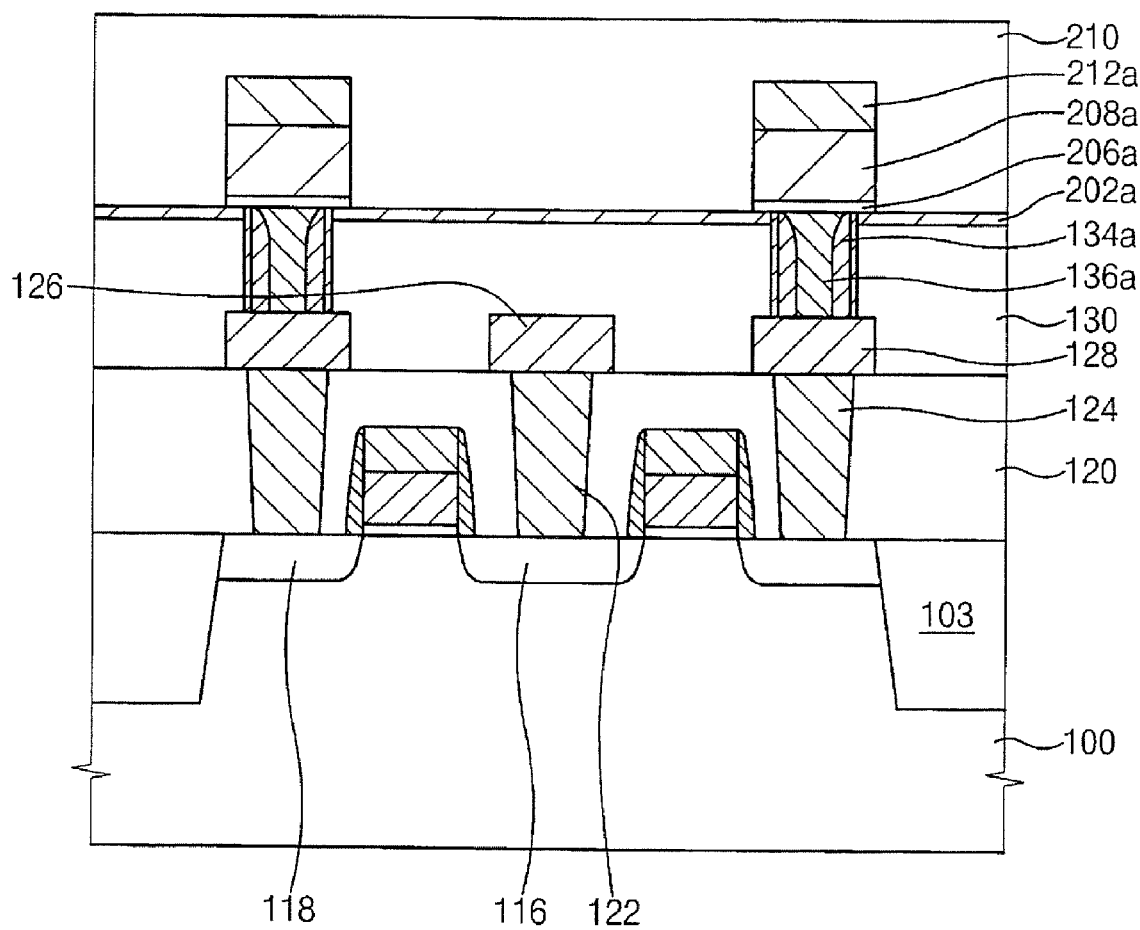

Referring to the embodiments of FIG. 18, the conductive capping layer 212, the phase-changeable material layer 208 and the seed layer 206 may be selectively etched to thereby form a conductive capping pattern 212a, a phase-changeable material layer pattern 208a and a seed layer pattern 206a. The seed layer pattern 206 makes contact with the lower electrode 136a.

A second insulating interlayer 210 may be formed on the silicon nitride layer 202a to cover the conductive capping pattern 212a, the phase-changeable material layer pattern 208a and the seed layer pattern 206a.

Referring again to FIG. 11, the second insulating interlayer 210 may be selectively etched to form a second opening that partially exposes the conductive capping pattern 212a. A conductive layer (not shown) may be formed on the second insulating interlayer 210 to fill up the second opening. The conductive layer may be planarized, for example, by a planarization process, until the second insulating interlayer 210 is exposed. Thus, an upper electrode may be formed in the second opening.

An upper wiring pattern 216 may be formed on the second insulating interlayer 210 and the upper electrode. The upper wiring pattern 216 makes contact with the upper electrode. Thus, a phase-changeable memory device 2000 may be formed over the substrate 100.

According to some embodiments of the invention, a phase-changeable memory device may include a phase-changeable material layer pattern having a substantially uniform crystalline structure and a uniform grain size so that the phase-changeable memory device may operate with a relatively low driving voltage. Thus, some electrical characteristics of the phase-changeable memory device may be improved. In addition, a cell of the phase-changeable memory device may be highly integrated.

The foregoing is illustrative of the present invention and is not to be construed as limiting thereof. Although a few example embodiments of this invention have been described, those skilled in the art will readily appreciate that many modifications are possible in the example embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A phase-changeable memory device comprising:
a substrate having a contact region therein;
an insulating interlayer on the substrate;
a silicon nitride layer on an upper surface of the insulating interlayer opposite the substrate;
a lower electrode extending through the silicon nitride layer and the insulating interlayer and in electrical contact with the contact region of the substrate;
a phase-changeable material layer pattern on the lower electrode and extending across at least a portion of the silicon nitride layer that is between the phase-changeable material layer pattern and the insulating interlayer; and
an upper electrode on the phase-changeable material layer pattern;
wherein a surface portion of the silicon nitride layer has an increased nitrogen concentration relative to a lower portion of the silicon nitride layer.

2. The device of claim 1, further comprising a seed layer pattern on the lower electrode and the silicon nitride layer beneath the phase-changeable material layer pattern.

3. The device of claim 2, wherein the seed layer pattern comprises a material of a GeTe—$Sb_2Te_3$ binary system.

4. The device of claim 2, wherein the seed layer pattern includes a nitrogen dopant and/or an oxygen dopant.

5. The device of claim 2, wherein the seed layer pattern includes a transition metal dopant.

6. The device of claim 2, wherein the seed layer pattern comprises GeN and/or InN.

7. The device of claim 1, wherein the silicon nitride layer is directly on the upper surface of the insulating interlayer opposite the substrate.

8. The device of claim 1, further comprising a seed layer pattern between the lower electrode and the phase-changeable material layer pattern, wherein the seed layer pattern extends across the at least a portion of the silicon nitride layer that is between the phase-changeable material layer pattern and the insulating interlayer and is in direct contact with the silicon nitride layer.

9. A phase-changeable memory device comprising:
a substrate having a contact region therein;
an insulating interlayer on the substrate;
a silicon nitride layer on an upper surface of the insulating interlayer opposite the substrate;
a lower electrode extending through the silicon nitride layer and the insulating interlayer and in electrical contact with the contact region of the substrate;
a phase-changeable material layer pattern on the lower electrode and extending across at least a portion of the silicon nitride layer that is between the phase-changeable material layer pattern and the insulating interlayer;
an upper electrode on the phase-changeable material layer pattern; and
a seed layer pattern on the lower electrode and the silicon nitride layer beneath the phase-changeable material layer pattern;
wherein the seed layer pattern comprises an InGeSbTe compound and/or a GeSnSbTe compound.

10. A phase-changeable memory device comprising:
a substrate having a contact region therein;
an insulating interlayer on the substrate;
a silicon nitride layer on an upper surface of the insulating interlayer opposite the substrate;
a lower electrode extending through the silicon nitride layer and the insulating interlayer and in electrical contact with the contact region of the substrate;
a phase-changeable material layer pattern on the lower electrode and extending across at least a portion of the silicon nitride layer that is between the phase-changeable material layer pattern and the insulating interlayer; and
an upper electrode on the phase-changeable material layer pattern;
wherein a surface portion of the lower electrode has an increased nitrogen concentration relative to a lower portion of the lower electrode.

* * * * *